US011791277B2

(12) United States Patent
Liff et al.

(10) Patent No.: US 11,791,277 B2
(45) Date of Patent: *Oct. 17, 2023

(54) MICROELECTRONIC ASSEMBLIES

(71) Applicant: Intel Corporation, Santa Clara, CA (US)

(72) Inventors: Shawna M. Liff, Scottsdale, AZ (US); Adel A. Elsherbini, Tempe, AZ (US); Johanna M. Swan, Scottsdale, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/716,229

(22) Filed: Apr. 8, 2022

(65) Prior Publication Data
US 2022/0230964 A1 Jul. 21, 2022

Related U.S. Application Data

(63) Continuation of application No. 16/649,950, filed as application No. PCT/US2017/068905 on Dec. 29, 2017, now Pat. No. 11,335,642.

(51) Int. Cl.
H01L 25/065 (2023.01)
H01L 23/538 (2006.01)

(52) U.S. Cl.
CPC ........ H01L 23/5389 (2013.01); H01L 25/065 (2013.01)

(58) Field of Classification Search
CPC .... H01L 25/065; H01L 23/5389; H10B 80/00
See application file for complete search history.

(56) References Cited

U.S. PATENT DOCUMENTS

| 11,335,642 | B2* | 5/2022 | Liff ..................... H01L 23/5389 |
| 2014/0133105 | A1 | 5/2014 | Yee et al. |
| 2014/0299999 | A1 | 10/2014 | Hu et al. |
| 2015/0303174 | A1 | 10/2015 | Yu et al. |
| 2016/0233203 | A1 | 8/2016 | Chen et al. |
| 2016/0260695 | A1 | 9/2016 | Chung et al. |
| 2017/0092621 | A1* | 3/2017 | Das ..................... H01L 23/3736 |

(Continued)

FOREIGN PATENT DOCUMENTS

| DE | 112017008313 | 9/2020 |
| KR | 100870652 B1 | 11/2008 |

OTHER PUBLICATIONS

Final Office Action in U.S. Appl. No. 16/649,950 dated Oct. 8, 2021, 14 pages.

(Continued)

Primary Examiner — Timor Karimy
(74) Attorney, Agent, or Firm — Akona IP

(57) ABSTRACT

Microelectronic assemblies, and related devices and methods, are disclosed herein. For example, in some embodiments, a microelectronic assembly may include a first die comprising a first face and a second face; and a second die, the second die comprising a first face and a second face, wherein the second die further comprises a plurality of first conductive contacts at the first face and a plurality of second conductive contacts at the second face, and the second die is between first-level interconnect contacts of the microelectronic assembly and the first die.

15 Claims, 20 Drawing Sheets

(56) References Cited

U.S. PATENT DOCUMENTS

2017/0263518 A1    9/2017   Yu et al.
2018/0076257 A1    3/2018   McKnight et al.

OTHER PUBLICATIONS

International Preliminary Report on Patentability in International Application PCT/US2017/068905 dated Jul. 9, 2020, 10 pages.
International Search Report and Written Opinion in International Patent Application PCT/US2017/068905 dated Sep. 28, 2018, 11 pages.
Non Final Office Action in U.S. Appl. No. 16/649,950 dated Apr. 1, 2021, 14 pages.
Notice of Allowance in U.S. Appl. No. 16/649,950 dated Feb. 3, 2022, 9 pages.

* cited by examiner

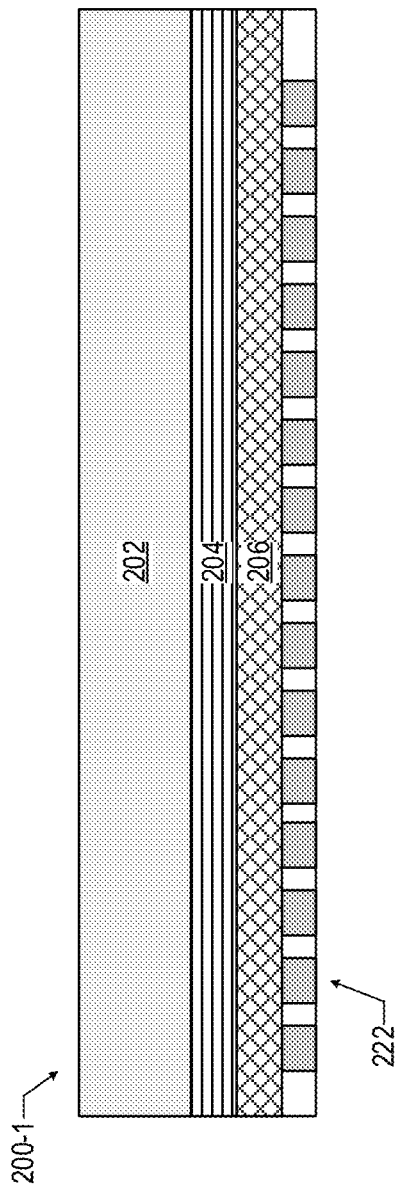
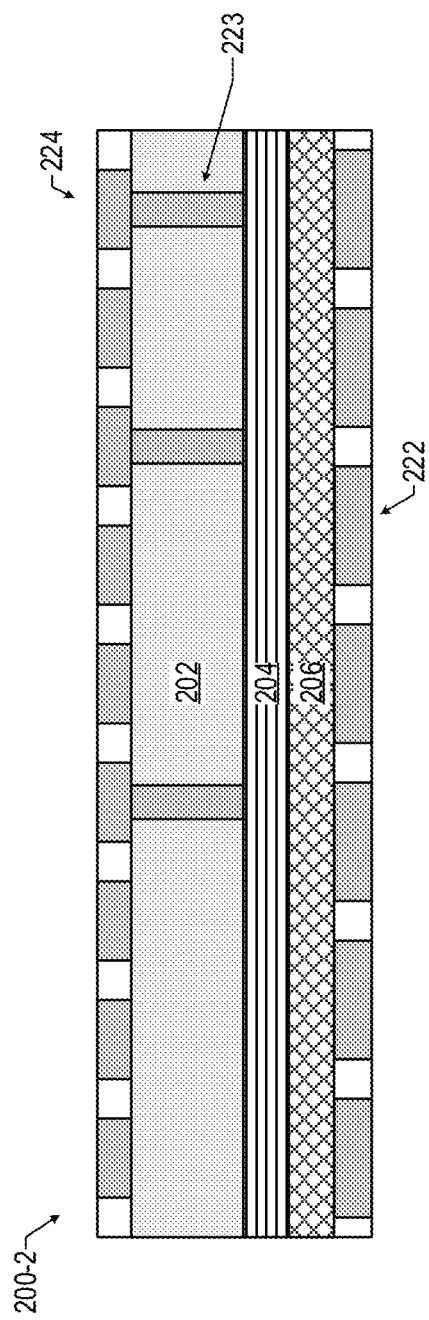
FIG. 2A
FIG. 2B

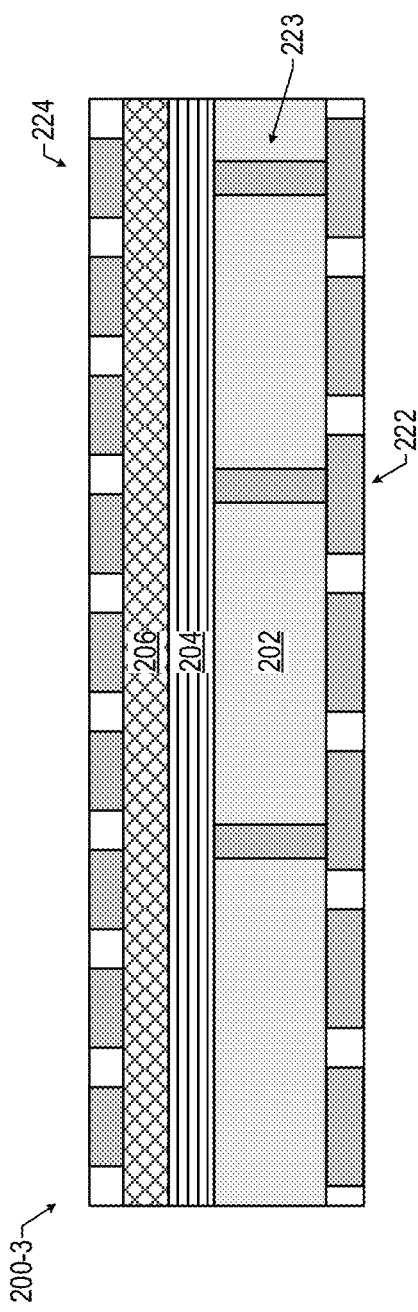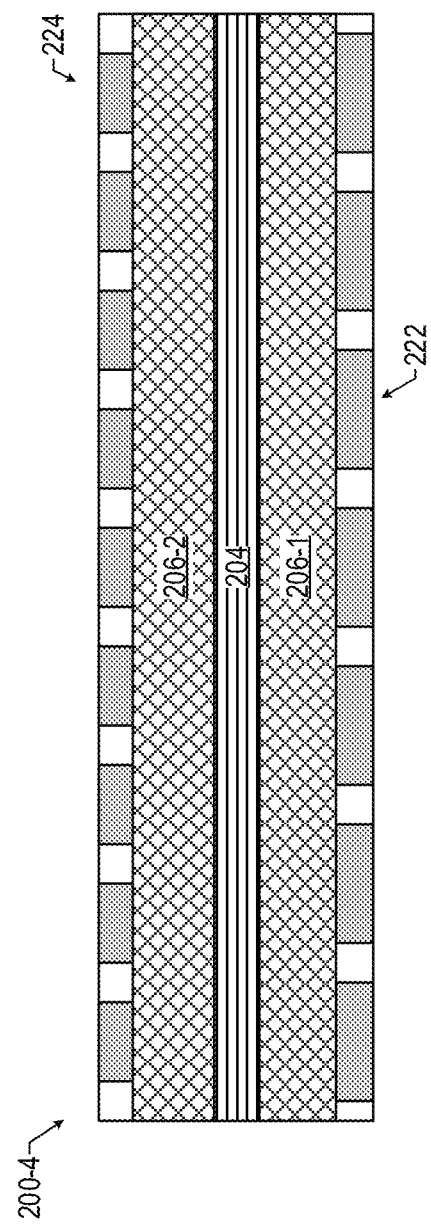
FIG. 2C
FIG. 2D

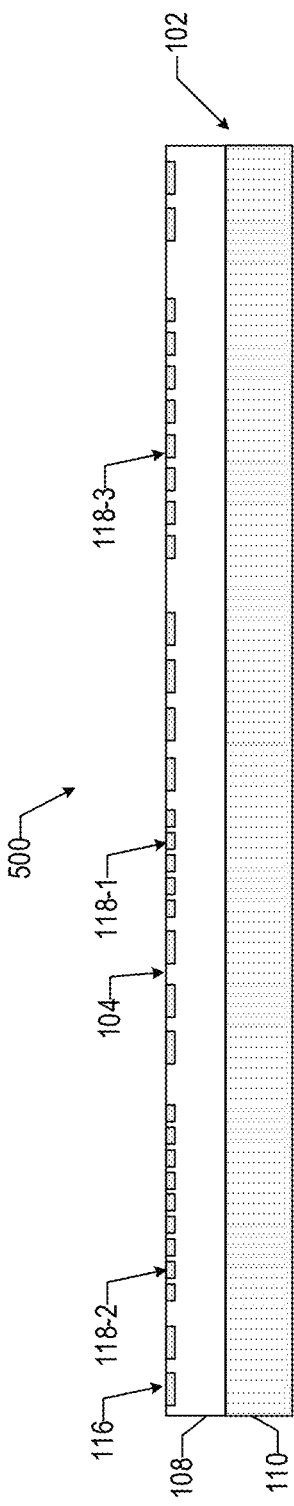
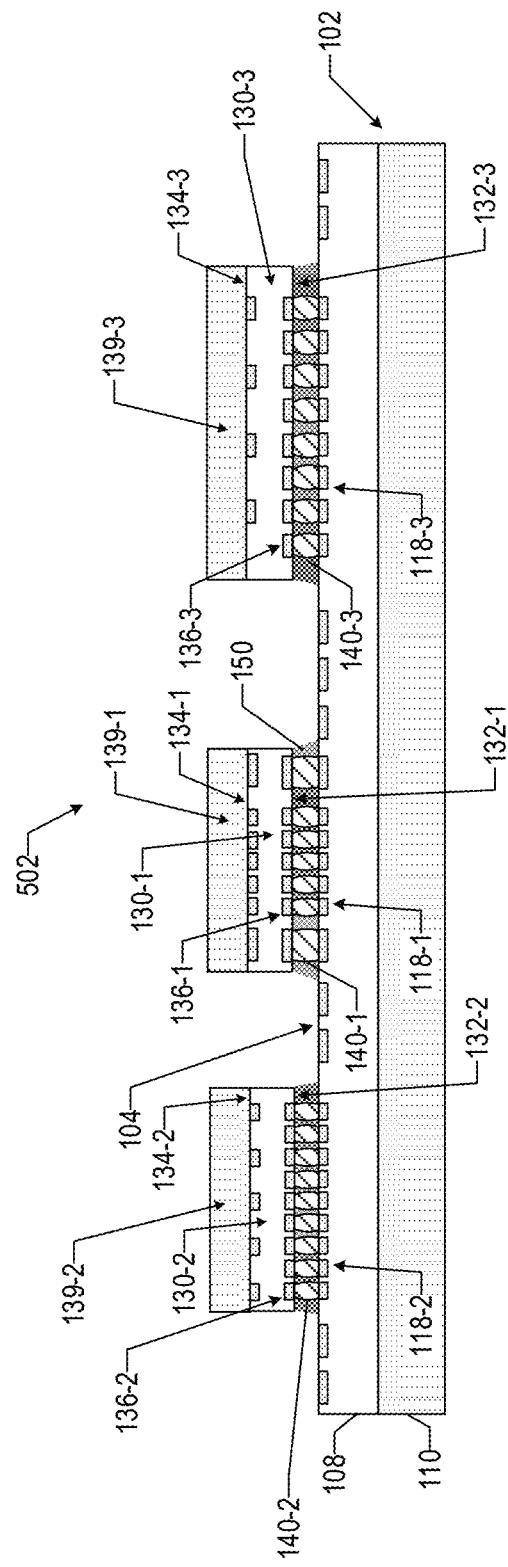
FIG. 4A
FIG. 4B

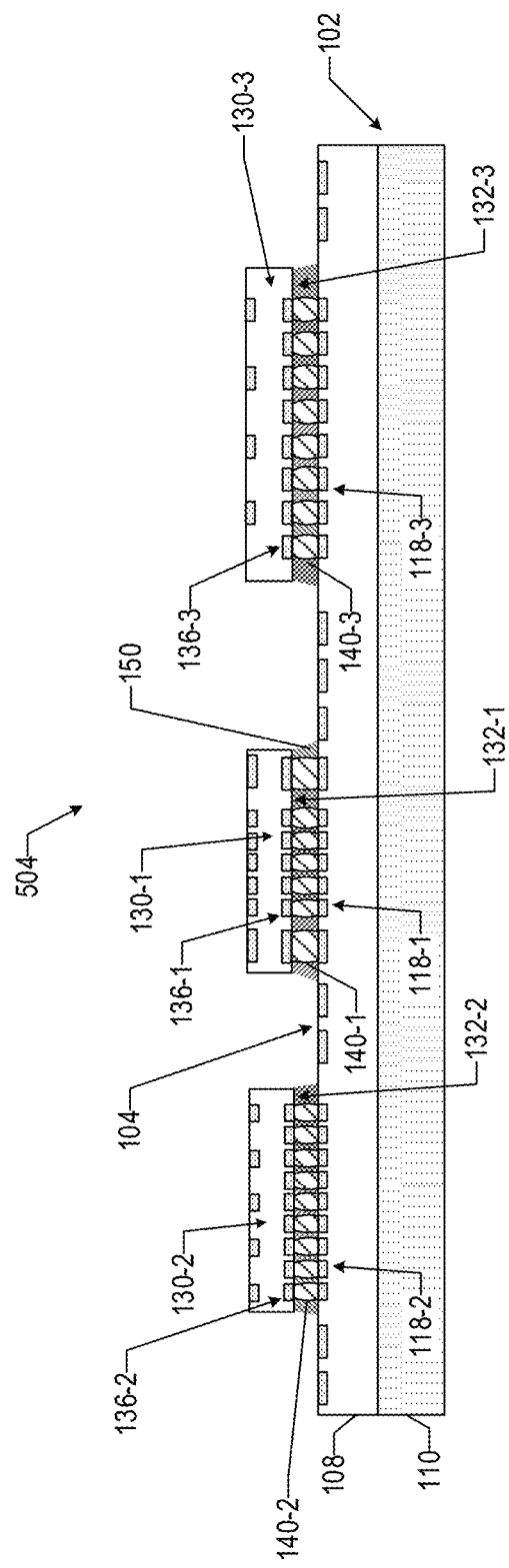

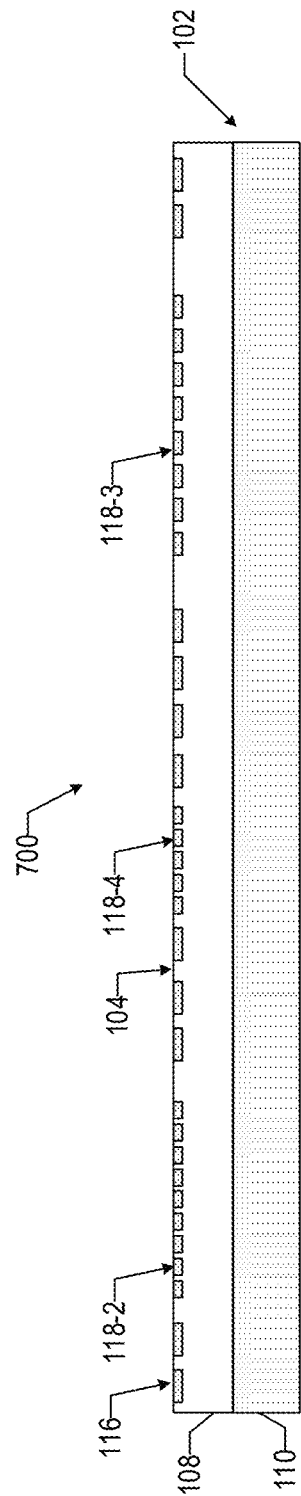

MICROELECTRONIC ASSEMBLIES

CROSS-REFERENCE TO RELATED APPLICATIONS

This application is a continuation (and claims the benefit of priority under 35 U.S.C. § 120) of U.S. application Ser. No. 16/649,950, filed Mar. 23, 2020 and entitled "MICROELECTRONIC ASSEMBLIES" which is a national stage application under 35 U.S.C. § 371 of PCT International Application Serial No. PCT/US2017/068905, filed on Dec. 29, 2017 and entitled "MICROELECTRONIC ASSEMBLIES," both of which disclosures are hereby incorporated by reference herein their entirety.

BACKGROUND

Integrated circuit devices (e.g., dies) are typically coupled together to integrate features or functionality and to facilitate connections to other components, such as circuit boards. However, current techniques for coupling integrated circuit devices are limited by manufacturing, device size, thermal considerations, and interconnect congestion, which may impact costs and implementations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 2A-2D are side, cross-sectional views of example dies that may be included in a microelectronic assembly, in accordance with various embodiments.

FIGS. 4A-4E are side, cross-sectional views of various stages in an example process for manufacturing the microelectronic assembly of FIG. 1, in accordance with various embodiments.

FIGS. 6A-6G are side, cross-sectional views of various stages in an example process for manufacturing the microelectronic assembly of FIG. 5.

DETAILED DESCRIPTION

Figure 1:
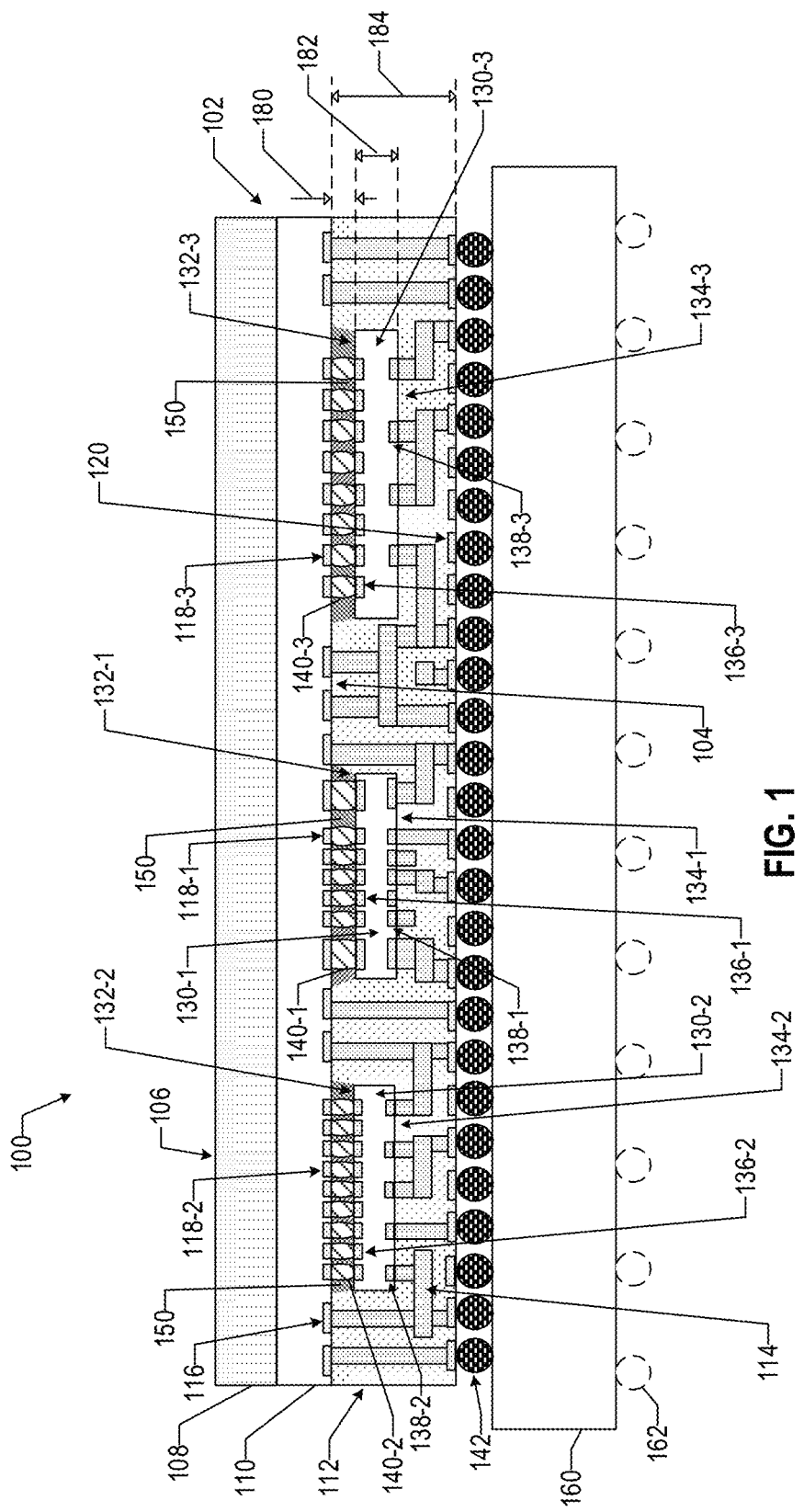
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a first die comprising a first face and a second face; and a second die, the second die comprising a first face and a second face, wherein the second die further comprises a plurality of first conductive contacts at the first face and a plurality of second conductive contacts at the second face, and the second die is between first-level interconnect contacts of the microelectronic assembly and the first die.

Communicating large numbers of signals between two or more dies in a multi-die integrated circuit (IC) package, sometimes referred to as a "composite die," is challenging due to the increasingly small size of such dies, thermal constraints, and power delivery constraints, among others. Various ones of the embodiments disclosed herein may help achieve reliable attachment of multiple IC dies at a lower cost, with improved power efficiency, with higher bandwidth, and/or with greater design flexibility, relative to conventional approaches. Various ones of the microelectronic assemblies disclosed herein may exhibit better power delivery and signal speed while reducing the size of the package relative to conventional approaches. The microelectronic assemblies disclosed herein may be particularly advantageous for small and low-profile applications in computers, tablets, industrial robots, server architectures, consumer electronics (e.g., wearable devices), and/or any other applications that may include heterogeneous technology integration.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 4" may be used to refer to the collection of drawings of FIGS. 4A-4E, the phrase "FIG. 6" may be used to refer to the collection of drawings of FIGS. 6A-6G, etc. although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad, socket, bump, or pillar, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the double-sided die 130-2, the double-sided die 130-3, the second-level interconnects 162 and/or the package substrate 160 may not be included. Further, FIG. 1 illustrates a number of elements that are omitted from subsequent drawings for ease of illustration, but may be included in any of the microelectronic assemblies 100 disclosed herein. Examples of such elements include the second-level interconnects 162 and/or the package substrate 160. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 102 and double-sided dies 130 having different functionality are included. In such embodiments, the microelectronic assembly 100 may be referred to as a SiP.

The microelectronic assembly 100 may include a double-sided die 130-1 coupled to a die 102 at a first face 104 of the die 102 and at a first face 132-1 of the double-sided die 130-1 by die-to-die (DTD) interconnects 140-1. In particular, the first face 104 of die 102 may include a set of conductive contacts 118-1 and the first face 132-1 of the double-sided die 130-1 may include a set of conductive contacts 136-1. The conductive contacts 118-1 at the first face 104 of die 102 may be electrically and mechanically coupled to the conductive contacts 136-1 at the first face 132-1 of the double-sided die 130-1 by DTD interconnects 140-1. The first face 104 of die 102 may also include conductive contacts 116 to electrically couple the die 102 to one or more interconnect structures 114 of a routing layer, such as a redistribution layer (RDL) 112 shown in the embodiment of FIG. 1. The double-sided die 130-1 may also include conductive contacts 138-1 at a second face 134-1 of the double-sided die 130-1. The conductive contacts 138-1 at the second face 134-1 of the die 130-1 may electrically couple the die double-sided 130-1 to one or more interconnect structures 114 of the redistribution layer 112. In some embodiments, die 102 may also be a double-sided die.

As referred to herein in this Specification, a double-sided die is a die that has interconnect layers (e.g., a metallization stack) on both sides (e.g., a "top" side and an opposing "bottom" side) of a device layer (which can potentially include multiple device layers) of the die. In a double-sided die, a device layer (which can potentially include multiple device layers) may be sandwiched by two metallization stacks providing conductive pathways between the device layer and the conductive contacts at the faces of the die, or by a metallization stack providing conductive pathways between the device layer and the conductive contacts at one face of the die and a semiconductor substrate with TSVs providing conductive pathways between the device layer and the conductive contacts at the other face of the die. Stated differently, a die may be double-sided in the sense that circuitry for the double-sided die may have interconnect layers and associated conductive contacts on both sides of the device layer (or layers).

The redistribution layer 112 may include an insulating material (e.g., a dielectric material formed in multiple layers, as known in the art) and one or more conductive pathways, referred to herein as interconnect structures 114, through the dielectric material (e.g., including conductive traces and/or conductive vias). In some embodiments, the insulating material of the redistribution layer may be composed of dielectric materials, bismaleimide triazine (BT) resin, polyimide materials, epoxy materials (e.g., glass reinforced epoxy matrix materials, epoxy build-up films, or the like), mold materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). The redistribution layer 112, via interconnect structures 114, may provide for the ability to fan-out or fan-in composite to package interconnects (e.g., first-level interconnects 142). For example, interconnects providing electrical connectivity between die 102 and package substrate 160 that may lie inside the X-Y area of die 102 may be considered fan-in interconnects. In another example, interconnects providing electrical connectivity between double-sided die 130-1 and package substrate 160 that may lie outside the X-Y area of double-sided die 130-1 may be considered fan-out interconnects.

Interconnect structures 114 of the redistribution layer 112 may extend between or among any dies 102/130 and conductive contacts 120 of the redistribution layer 112. Conductive contacts 120 of the redistribution layer 112 may be electrically and mechanically coupled to conductive contacts (not shown) of the package substrate 160 by first-level interconnects 142. Any of the conductive contacts disclosed herein (e.g., the conductive contacts 116, 118-1, 118-2, 118-3, 136-1, 136-2, 136-3, 138-1, 138-2, 138-3, and/or 120) may include bond pads, posts or pillars, bumps, or any other suitable conductive contact, for example.

In some embodiments, one or more of the interconnect structures 114 of the redistribution layer 112 may extend between one or more conductive contacts 116 at the first surface 104 of the die 102 and one or more conductive contacts 120 of the redistribution layer 112 to provide electrical interconnection between the die 102 and the conductive contacts. In some embodiments, one or more of the interconnect structures 114 of the redistribution layer 112 may extend between a conductive contact at the second face of a die coupled to die 102, such as a conductive contact 138-1 at a second face 134-1 of double-sided die 130-1, and one or more conductive contacts 120 of the redistribution layer 112 to provide electrical interconnection among the conductive contacts. In still some embodiments, one or more interconnect structures 114 of the redistribution layer 112 may electrically interconnect two or more conductive contacts 116 at the first face 104 of the die 102 and one or more conductive contacts 120 of the redistribution layer 112 to provide electrical interconnection among the conductive contacts. In still some embodiments, one or more interconnect structures 114 of the redistribution layer 112 may electrically interconnect two or more conductive contacts at the second face of a die (e.g., conductive contacts 138-3 at the second face 134-3 of double-sided die 130-3) coupled to die 102 and one or more conductive contacts 120 of the redistribution layer 112 to provide electrical interconnections among the conductive contacts. In still some embodiments, one or more interconnect structures 114 of the redistribution layer 112 may electrically interconnect one or more conductive contacts 116 at the first face 104 of the die 102 and one or more conductive contacts at the second face of one or more dies coupled to die 102.

The dies 102/130, among others disclosed herein, may include circuitry, which may include one or more device layers including active or passive circuitry (e.g., transistors, diodes, resistors, inductors, capacitors, among others) and one or more interconnect layers (e.g., as discussed below with reference to FIGS. 9-10). In various embodiments, one or more interconnect layers may be present on one or both sides of circuitry for dies 102/130 (e.g., as discussed below with reference to FIGS. 9-10). In some embodiments, the double-sided die 130-1 may be the source and/or destination of signals communicated between the double-sided die 130-1 and other double-sided dies 130 and/or die 102 included in the microelectronic assembly 100. In some embodiments, interconnect layers for a die (e.g., die 130-1, etc.) may include conductive pathways to route power, ground, and/or signals between different ones of the double-sided dies 130 and die 102, between die 102 and one or more conductive contacts 120 of the redistribution layer 112, and/or between different ones of double-sided dies 130 and one or more conductive contacts 120 of the redistribution layer 112.

In some embodiments, the double-sided die 130-1 may couple directly to power and/or ground lines in the redistribution layer 112. By allowing the double-sided die 130-1 to couple directly to power and/or ground lines in the redistribution layer 112, such power and/or ground lines need not be routed through the die 102, allowing the die 130-1 to be made smaller or to include more active circuitry or signal pathways. Thus, the larger interconnect structures 114 of the redistribution layer 112 (e.g., larger in comparison to interconnect layers within dies) can, in some embodiments, provide direct power delivery to all components (e.g., double-sided dies 130) coupled to the die 102 rather than routing power and/or ground through die 102.

Although FIG. 1 illustrates a specific number and arrangement of interconnect structures 114 in the redistribution layer 112, these are simply illustrative and any suitable number and arrangement may be used. The interconnect structures 114 disclosed herein (e.g., conductive traces and/or conductive vias) may be formed of any appropriate conductive material, such as copper, silver, nickel, gold, aluminum, or other metals or alloys, for example.

The dies 102/130, among others disclosed herein, may include an insulating material (e.g., a dielectric material formed in multiple layers, or semiconductor material, as known in the art) and multiple conductive pathways formed through the insulating material. In some embodiments, the insulating material of a die 102/130 may include a dielectric material, such as BT resin, polyimide materials, glass reinforced epoxy matrix materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). For example, one or more of the dies 102/130 may include a dielectric build-up film, such as epoxy or polyimide based dielectric build-up film. In some embodiments, the active material of dies 102/130 may be a semiconductor material, such as silicon, germanium, indium antimonide, lead telluride, indium arsenide, indium phosphide, gallium arsenide, or gallium antimonide. Further active materials classified as group II-VI, III-V, or IV may also be used as the active substrate materials of dies 102/130.

One or more of dies 102/130, among others disclosed herein, may also include a die substrate on one, both, or no sides of circuitry for a given die. For the embodiment of FIG. 1, for example, die 102 may include circuitry 110 and a die substrate 108 extending from the circuitry 110 to a second face 106 of the die 102. The die substrate 108 may be a crystalline substrate formed using a bulk silicon or silicon-on-insulator (SOI) substructure, silicon carbide, etc. Other substrate materials may be used, as desired depending on design and/or implementation. In some embodiments, thru-semiconductor vias (TSVs), which may include a conductive material via, such as a metal via, isolated from the surrounding substrate by a barrier material, such as oxide, may be included in the die substrate for a die (e.g., on one or both sides of the die) through which power, ground, and/or signals may be transmitted between a die and one or more other dies, package substrates (e.g., printed circuit boards), interposers, combinations thereof, or the like that may be interconnected with the die.

The microelectronic assembly 100 of FIG. 1 may also include a double-sided die 130-2. The double-sided die 130-2 may be electrically and mechanically coupled to die 102 by DTD interconnects 140-2. In particular, the first face 104 of die 102 may include a set of conductive contacts 118-2 and the first face 132-2 of the double-sided die 130-2 may include a set of conductive contacts 136-2. The conductive contacts 118-2 at the first face 104 of die 102 may be electrically and mechanically coupled to the conductive contacts 136-2 at the first face 132-2 of the double-sided die 130-2 by DTD interconnects 140-2. The double-sided die 130-2 may also include conductive contacts 138-2 at a second face 134-2 of the double-sided die 130-2. The conductive contacts 138-2 at the second face 134-2 of the die 130-2 may electrically couple the double-sided die 130-2 to one or more interconnect structures 114 of the redistribution layer 112.

The microelectronic assembly 100 of FIG. 1 may also include a double-sided die 130-3. The double-sided die 130-3 may be electrically and mechanically coupled to die 102 by DTD interconnects 140-3. In particular, the first face 104 of die 102 may include a set of conductive contacts 118-3 and the first face 132-3 of the double-sided die 130-3 may include a set of conductive contacts 136-3. The conductive contacts 118-3 at the first face 104 of die 102 may be electrically and mechanically coupled to the conductive contacts 136-3 at the first face 132-3 of the double-sided die 130-3 by DTD interconnects 140-3. The double-sided die 130-3 may also include conductive contacts 138-3 at a second face 134-3 of the double-sided die 130-3. The conductive contacts 138-3 at the second face 134-3 of the die 130-3 may electrically couple the double-sided die 130-3 to one or more interconnect structures 114 of the redistribution layer 112.

In some instances, die 102 may be referred to as a base, larger die and double-sided dies 130 may be referred to as smaller dies (in the sense that die 102 may have a larger X-Y area than the X-Y areas of each of individual ones of double-sided dies 130-1/130-2/130-3). In some embodiments, die 102 may be a single die or may be a composite die or monolithic IC (sometimes referred to as a "3D IC", "3D stack", "3D monolithic IC", combinations thereof, or the like).

The base, larger die 102 may include "coarser" conductive contacts 116 coupled to interconnect structures 114 of the redistribution layer 112 and "finer" conductive contacts 118 coupled to smaller double-sided dies 130. For the embodiment of FIG. 1, the die 102 of the microelectronic assembly 100 may be a single-sided die (in the sense that the die 102 only has conductive contacts 116/118 on a single surface) and may be a mixed pitch die (in the sense that the die 102 has sets of die-to-routing layer conductive contacts 116 and DTD conductive contacts 118 with different pitch). Further, die 102 may accommodate mixed pitch DTD conductive contacts for different individual ones of double-sided dies 130-1, 130-2, and 130-3. Even further, die 102 may accommodate mixed pitch DTD conductive contacts for an individual one of the smaller dies, such as conductive contacts 136-1 of double-sided die 130-1.

As noted above, dies 130 may be double-sided dies in the sense that circuitry for the double-sided dies 130 have interconnect layers and conductive contacts on both sides of device layer (or layers). Individual ones of double-sided dies 130-1, 130-2, 130-3 may, in various embodiments, have same or different pitches on either side of the dies (e.g., conductive contacts 136-2 at the first face 132-2 of double-sided die 130-2 may have a different pitch than conductive contacts 138-2 at the second face 134-2 of double-sided die 130-2). Features of double-sided dies are discussed in more detail in FIGS. 2A-2D herein. Although the embodiment of FIG. 1 includes base die 102 as a single-sided die, in other embodiments, base die 102 may also be a double-sided die.

In various embodiments, the pitch of coarser pitch conductive contacts (e.g., conductive contacts 116 of die 102) may range between 40 microns and 200 microns. In general, coarser pitches are better for power delivery than finer pitches. In various embodiments, the pitch of finer pitch conductive contacts (e.g., conductive contacts 118 of double-sided dies 130) may range between 0.8 microns and 55 microns. In general, finer pitches are better for high bandwidth signaling than coarser pitches. In some embodiments, an underfill material 150 may extend between different ones of double-sided dies 130 and die 102 around associated DTD interconnects 140. The underfill material 150 may be an insulating material, such as an appropriate epoxy material or carbon-doped or spin-on-dielectric or oxide. In some embodiments, the underfill material 150 may be an epoxy flux that assists with coupling the double-sided dies 130-1/130-2/130-3 to the die 102 when forming the DTD interconnects 140-1/140-2/140-3, and then polymerizes and encapsulates the interconnects. The underfill material 150 may be selected to have a coefficient of thermal expansion (CTE) that may mitigate or minimize the stress between the dies 102/130 arising from uneven thermal expansion in the microelectronic assembly 100. In some embodiments, the CTE of the underfill material 150 may have a value that may be larger than the CTE of the die 102 (e.g., the CTE of the dielectric material of the die 102) and a CTE of the double-sided dies 130 if the modulus of the dies is low.

The microelectronic assembly 100 of FIG. 1 may also include a package substrate 160. The microelectronic assembly 100 may be coupled to the package substrate 160 by first-level interconnects 142. In particular, conductive contacts 120 of the redistribution layer 112, which may also be referred to as first-level interconnect contacts of the microelectronic assembly 100, may be electrically and mechanically coupled to conductive contacts (not shown) of the package substrate 160 by the first-level interconnects 142 using any suitable technique. The first-level interconnects 142 illustrated in FIG. 1 are solder balls (e.g., for a ball grid array arrangement), but any suitable first-level interconnects 142 may be used (e.g., solder, non-solder, pins in a pin grid array arrangement, lands in a land grid array arrangement, wirebond, or copper pillar with solder cap). In some embodiments, the package substrate 160 may be coupled to a circuit board (not shown) by second-level interconnects 162 using any suitable technique. The second-level interconnects 162 illustrated in FIG. 1 are solder balls (e.g., for a ball grid array arrangement), but any suitable second-level interconnects 162 may be used (e.g., solder, non-solder, pins in a pin grid array arrangement, lands in a land grid array arrangement, wirebond, or copper pillar with solder cap).

The package substrate 160 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 160 may be a dielectric material, such as an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 160 is formed using standard printed circuit board (PCB) processes, the package substrate 160 may include FR-4, and the conductive pathways in the package substrate 160 may be formed by patterned sheets of copper separated by build-up layers of the FR-4. The conductive pathways in the package substrate 160 may be bordered by liner materials, such as adhesion liners and/or barrier liners, as suitable.

The DTD interconnects 140 disclosed herein may take any suitable form. The DTD interconnects 140 may have a finer pitch than the connections to interconnect structures 114 of the redistribution layer 112 in a microelectronic assembly. In some embodiments, the dies 102/130 on either side of a set of DTD interconnects 140 may be unpackaged dies, and/or the DTD interconnects 140 may include small conductive bumps or pillars (e.g., copper bumps or pillars) attached to conductive contacts by solder. In some embodiments, a set of DTD interconnects 140 may include solder. DTD interconnects 140 that include solder may include any appropriate solder material, such as any of the materials discussed above. In some embodiments, a set of DTD interconnects 140 may include an anisotropic conductive material, such as any of the materials discussed above. In some embodiments, the DTD interconnects 140 may be used as data transfer lanes, while interconnections to interconnect structures 114 of the redistribution layer 112 may be used for power and ground lines, among others.

In some embodiments, some or all of the DTD interconnects 140 in a microelectronic assembly 100 may be metal-to-metal interconnects such as copper-to-copper interconnects, plated interconnects (e.g., copper, nickel, and/or gold capped pillar or pad with solder such as Sn, SnAg, SnIn) or any other known metallurgy. In such embodiments, the conductive contacts on either side (e.g., conductive contacts 136-1 and conductive contacts 118-1, conductive contacts 136-2 and conductive contacts 118-2, and/or conductive contacts 136-3 and conductive contacts 118-3) of the DTD interconnect 140 (e.g., 140-1, 140-2, and/or 140-3) may be bonded together without the use of intervening solder or an anisotropic conductive material. Metal-to-metal interconnect techniques may include direct bonding or hybrid bonding, sometimes referred to as diffusion bonding. In some metal-to-metal interconnects that utilize direct bonding, a first die or wafer (if die are redistributed) having a pristine, planar, and active surface may be placed, typically at room temperature, on a second die or wafer also having a pristine, planar, and active surface (e.g., to perform die-to-wafer bonding, die-to-die bonding, or wafer-to-wafer bonding). A force is applied to the dies (in batch) and/or wafers to form a van der Waals bond between the dies and/or wafers. The bonded dies and/or wafers are then annealed at a high temperature (typically 150° Celsius (C) or higher) to form permanent bonds between the conductive contacts and between dielectric surfaces.

In some metal-to-metal interconnects that utilize hybrid bonding, a dielectric material (e.g., silicon oxide, silicon nitride, or silicon carbide, among others) may be present between the metals bonded together (e.g., between copper pads or posts that provide the associated conductive contacts). For hybrid bonding, conductive contacts may be bonded together under elevated pressure and/or temperature (e.g., thermal compression bonding, typically performed at temperatures greater than 150° C. and greater than 20 megapascals (MPa), which may vary depending on bump pitch, materials, etc.). In some embodiments, a spin-on-dielectric material may be patterned around the conductive to fill any void spaces during bonding.

Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, some or all of the DTD interconnects 140 in a microelectronic assembly 100 may be solder interconnects that include a solder with a higher melting point than a solder included in some or all of the first-level interconnects 142. For example, when the DTD interconnects 140 in a microelectronic assembly 100 are formed before the first-level interconnects 142 are formed (e.g., as discussed below with reference to FIGS. 4A-4E), solder-based DTD interconnects 140 may use a higher temperature solder (e.g., with a melting point above 200° C.), while the first-level interconnects 142 may use a lower temperature solder (e.g., with a melting point below 200° C.). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth) or tin, silver, and bismuth. In some embodiments, a lower-temperature solder may include indium, indium and tin, or gallium. In some embodiments, if the DTD interconnects 140 leverage an intermetallic compound (IMC), the interconnect may be designed to convert in its entirety such that the subsequent first level reflow may not impact this interconnect even if the formulations are identical.

In various embodiments of the microelectronic assembly of FIG. 1, the DTD interconnects 140 may vary in distance 180 ranging from the sub-ten microns to the low tens of microns. The distance 180 may extend between the first face 104 of the die 102 and any first face 132 of any of individual ones of double-sided dies 130. Distances 180 between die 102 and individual ones of double-sided dies 130 may be different among the double-sided dies 130. For embodiments in which metal-to-metal interconnects are used (e.g., direct bonding or hybrid bonding), the distance 180 may range between 1.5 microns and 10 microns or less. For embodiments in which solder interconnects are used, the distance 180 may range between 4 microns and 40 microns.

In various embodiments, interconnecting dies using DTD interconnects 140 may provide various advantages as compared to interconnecting dies using other interconnect techniques such as side-by-side interconnects. In at least one embodiment, parasitics (e.g., parasitic capacitances or parasitic resistances) may be lowered using DTD interconnects 140 as compared to using side-by-side interconnects. In general, long interconnects degrade operating performance of interconnected dies more than short interconnects through one or more of: reducing signaling bandwidth between dies, inducing insertion loss, inducing cross-talk interference between or among signals communicated between dies, inducing resistance which drives the amplification power needed to send a signal farther, among others. When connecting dies side-by-side, interconnects are typically routed down from one die, through a substrate, over, and back up to another die, which may create a long transmission line that may cause parasitics to be induced among the interconnects.

For various embodiments of the microelectronic assembly 100 of FIG. 1, DTD interconnects 140 may provide one or more advantages in comparison to other interconnect techniques including, but not limited to, providing shorter interconnect distances, which may reduce parasitics interconnecting dies.

The elements of the microelectronic assembly 100 and/or other microelectronic assemblies disclosed herein may have any suitable dimensions. In some embodiments, individual ones of double-sided dies 130 may range in thickness 182 from 10 microns to 75 microns. For example, ultrathin dies may range in thickness from 10 microns to 30 microns. In some embodiments, the microelectronic assembly 100 may include individual ones of double-sided dies 130 having a same or different thickness, as discussed in further detail herein. In various embodiments, the base die 102 may range in thickness from 50 microns to 780 microns. In various embodiments, the redistribution layer 112 may range in thickness 184 between 15 microns and 100 microns and may depend on the thicknesses of the double-sided dies 130.

Further, the microelectronic assembly 100 and/or other microelectronic assemblies disclosed herein may, in some embodiments, advantageously provide for incorporating mixed node (e.g., different process technologies such as 10 nanometer (nm), 14 nm, 28 nm, etc.) and/or heterogeneous technology integration (e.g., GaN versus radio frequency (RF) complementary metal-oxide-semiconductor (CMOS) versus SOI versus SiGe) into a composite die, packaged solution. For example, within a particular technology (e.g., silicon) there may be different manufacturing processes depending on the semiconductor type (e.g., type of silicon such as high resistivity, low resistivity, doped, etc.) or process node. Further, for a given semiconductor type there may be different manufacturing processes (e.g., process temperature limitations for InP relative to standard silicon CMOS) and minimum feature length scale for different process node technologies (e.g., 7 nm vs 28 nm) and types of devices (e.g., very low power may use one type of transistors, very high power may use another type of transistors, etc.). A technology node may refer to the minimum feature size associated with a semiconductor process flow (e.g., transistor gate length and leakage or product attribute, etc.) formed using a particular semiconductor type, process, feature size, etc. Even further, some technology nodes may be better suited for analog devices, some for digital devices, some for optical devices, and so on. When designing mixed device type circuits on one technology node, an integrated device manufacturer (IDM) typically selects the best technology node that suits a particular product or performance objective and, as a result, sub-optimizes the device types that are not best suited for the particular technology node.

In contrast, embodiments of the microelectronic assembly 100 and/or other microelectronic assemblies disclosed herein may advantageously provide for integrating mixed nodes and/or heterogeneous technologies into a composite die, packaged solution, such as a composite die that may include double-sided dies 130 coupled to die 102 and the redistribution layer 112 providing fan-in and/or fan-out interconnect structures 114 to interconnect to a package substrate (e.g., package substrate 160). Thus, embodiments of microelectronic assembly 100 may advantageously provide for increased flexibility for integrating mixed nodes and/or heterogeneous technologies in which: a minimum area may be needed per integrated circuit function (e.g., the best process for low power RF may be used, the best process for digital static random access memory (SRAM) circuit shrink may be used, etc.); fine pitch interconnects may be used in high bandwidth areas (e.g., for DTD interconnects) to ease routing congestion issues; and/or direct power delivery may be provided with reduced power penalties (e.g., by using power and/or ground layers within the redistribution layer 112, as opposed to routing power and/or ground through die 102).

In some embodiments, another advantage of microelectronic assembly 100 and/or other microelectronic assemblies disclosed herein may include improved thermal spreading for dies 130. For example, the base die 102 may be a thermal spreader for the small dies 130 leveraging the interconnect structures 114 as well. In some embodiments in which the small dies 130 may be ultrathin dies, CTE matching between the base die 102 and the ultrathin dies may improve the robustness of the ultrathin dies.

The dies 102/130 included in a microelectronic assembly 100 may have any suitable structure. For example, FIGS. 2A-2D illustrate example ones of dies 200 that may be included in a microelectronic assembly 100. The dies 200 illustrated in FIGS. 2A-2D may include a die substrate 202, one or more device layers 204, and/or one or more metallization stacks 206; these elements are discussed in further detail below with reference to FIGS. 10-11.

FIG. 2A is a side, cross-sectional view of an example die 200-1, in accordance with various embodiments. In at least one embodiment, example die 200-1 may be die 102 of the embodiment of FIG. 1. As illustrated in FIG. 2A, the die 200-1 may include a die substrate 202, one or more device layers 204, and a metallization stack 206. The metallization stack 206 may be between conductive contacts 222 and the device layer 204, and the device layer 204 may be between the die substrate 202 and the metallization stack 206. Conductive pathways through the metallization stack 206 (e.g., formed of conductive lines and/or vias) may conductively couple devices (e.g., transistors) in the device layer 204 and the conductive contacts 222. Although the die 200-1 of FIG. 2A is discussed with reference to die 102 of the embodiment of FIG. 1, the structure of the die 200-1 represented in FIG. 2A may be the structure of any suitable ones of the single-sided dies disclosed herein.

FIG. 2B is a side, cross-sectional view of an example die 200-2, in accordance with various embodiments. In some embodiments, the example die 200-2 may be any of the double-sided dies 130 of the embodiment of FIG. 1. As illustrated in FIG. 2B, the die 200-2 may include a die substrate 202, one or more device layers 204, and a metallization stack 206. The metallization stack 206 may be between conductive contacts 222 and the device layer 204, the device layer 204 may be between the die substrate 202 and the metallization stack 206, and the die substrate 202 may be between the device layer 204 and the conductive contacts 224. One or more TSVs 223 may extend through the die substrate 202. Conductive pathways through the metallization stack 206 (e.g., formed of conductive lines and/or vias) may conductively couple devices (e.g., transistors) in the device layer 204 and the conductive contacts 222, while the TSVs 223 may conductively couple devices in the device layer 204 and the conductive contacts 224. Although the die 200-2 of FIG. 2B is discussed with reference to the double-sided dies 130 of the embodiment of FIG. 1, the structure of the die 200-2 represented in FIG. 2B may be the structure of any suitable ones of the double-sided dies disclosed herein.

FIG. 2C is a side, cross-sectional view of an example die 200-3, in accordance with various embodiments. In some embodiments, the example die 200-3 may be any of the double-sided dies 130 of the embodiment of FIG. 1. As illustrated in FIG. 2C, the die 200-3 may include a die substrate 202, one or more device layers 204, and a metallization stack 206. The metallization stack 206 may be between the conductive contacts 224 and the device layer 204, the device layer 204 may be between the die substrate 202 and the metallization stack 206, and the die substrate 202 may be between the device layer 204 and the conductive contacts 222. One or more TSVs 223 may extend through the die substrate 202. Conductive pathways through the metallization stack 206 may conductively couple devices in the device layer 204 and the conductive contacts 224, while the TSVs 223 may conductively couple devices in the device layer 204 and the conductive contacts 222. Although the die 200-2 of FIG. 2B is discussed with reference to the double-sided dies 130 of the embodiment of FIG. 1, the structure of the die 200-2 represented in FIG. 2B may be the structure of any suitable ones of the double-sided dies disclosed herein.

FIG. 2D is a side, cross-sectional view of an example die 200-4, in accordance with various embodiments. In some embodiments, the example die 200-4 may be any of the double-sided dies 130 of the embodiment of FIG. 1. As illustrated in FIG. 2D, the die 200-4 may include a first metallization stack 206-1, one or more device layers 204, and a second metallization stack 206-2. The first metallization stack 206-1 may be between the conductive contacts 222 and the device layer 204, the device layer 204 may be between the first metallization stack 206-1 and the second metallization stack 204-2, and the second metallization stack 206-2 may be between the device layer 204 and the conductive contacts 224. Conductive pathways through the first metallization stack 206-1 may conductively couple devices in the device layer 204 and the conductive contacts 222, while the conductive pathways through the second metallization stack 206-2 may conductively couple devices in the device layer 204 and the conductive contacts 224. In the embodiment of FIG. 2D, the device layer 204 may first be fabricated on a die substrate 202 (e.g., as discussed below for FIG. 10), one metallization stack 206 may be formed on the device layer 204 (e.g., as discussed below for FIG. 10), then the bulk of the die substrate 202 may be removed and the second metallization stack 206 formed on the other side of the device layer 204.

The dies discussed herein may have structures other than those depicted in FIGS. 2A-2D. For example, in some embodiments, a double-sided die 130 may have a structure similar to that depicted in FIG. 2D, and further including a die substrate (and TSVs therein) between the first metallization stack and the conductive contacts.

Other advantages of the microelectronic assembly 100 and/or other microelectronic assemblies disclosed herein may be realized through integrating double-sided dies into microelectronic assemblies. For example, transistor density may be reduced for dies having TSVs because there are "restricted zones" in the device layers that surround TSVs in which transistors cannot be placed. Whereas for dies having no TSVs, conductive pathways through metallization stacks can "land" on different layers within the device layers of a die without effecting transistor density of the device layer of the die. Thus, embodiments of microelectronic assembly 100 and/or other microelectronic assemblies disclosed herein may facilitate new 3D monolithic integration approaches that may provide more freedom for integrating mixed nodes and/or heterogeneous technologies having less perforation of device layers.

Figure 3:
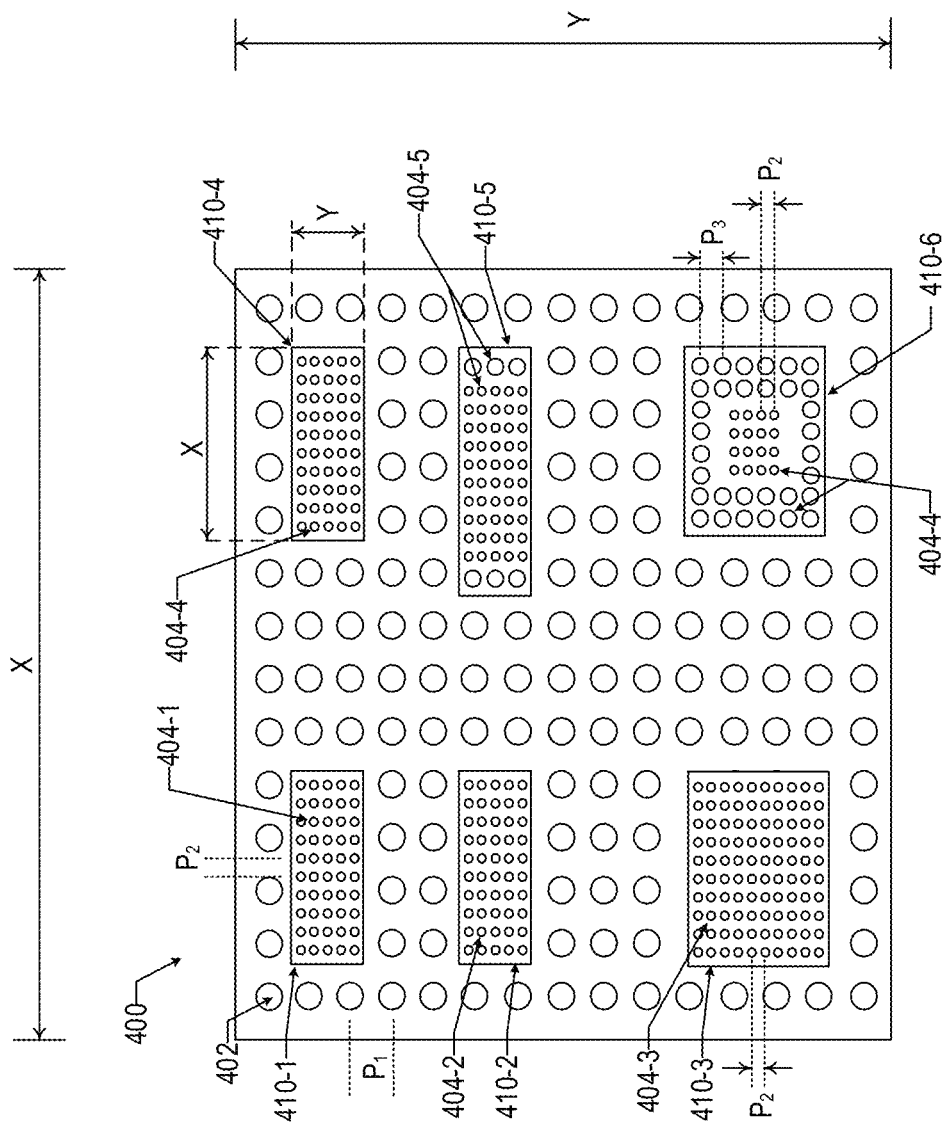
FIG. 3 is a bottom view of an example die that may be included in a microelectronic assembly, in accordance with various embodiments.

Referring to FIG. 3, FIG. 3 is a bottom view of an example die 400 that may be included in microelectronic assemblies discussed herein, in accordance with various embodiments. For the embodiment of FIG. 3, die 400 may be a larger, base die to which a number of smaller dies (not shown) may be coupled. Die 400 may include a number of "landing zones" 410 that include DTD conductive contacts 404 arranged in a particular footprint (e.g., a pattern or arrangement of conductive contacts) that facilitates coupling smaller dies to the base die 400 at the landing zones 410. Although the embodiment of FIG. 4 illustrates six (6) landing zones 410-1/410-2/410-3/410-4/410-5/410-6 to accommodate coupling six dies to die 400, it is to be understood that any number of one or more dies may be coupled to a base die according to embodiments disclosed herein depending on size, design, implementation, thermal, and/or any other relevant considerations.

As illustrated in the embodiment of FIG. 3, die 400 can include "coarser" pitch conductive contacts 402 having a pitch $P_1$ to interconnect die 400 to a package substrate (e.g., package substrate 160 of FIG. 1). Die 400 can further include "finer" pitch conductive contacts 404 to interconnect smaller dies (not shown) to die 400 at landing zones 410. For example, a first landing zone 410-1 may include first conductive contacts arranged in a particular footprint having a pitch $P_2$, which may be a finer pitch than pitch $P_1$. A second landing zone 410-2 may include second conductive contacts 404-2 arranged in a particular footprint. A third landing zone 410-3 may include third conductive contacts 404-3 arranged in a particular footprint. A fourth landing zone 410-4 may include fourth conductive contacts 404-4 arranged in a particular footprint. A fifth landing zone 410-5 may include fifth conductive contacts 404-5. A sixth landing zone 410-6 may include sixth conductive contacts 404-6 arranged in a particular footprint. The sixth landing zone 410-6 may include mixed pitch conductive contacts having pitches $P_2$ and $P_3$, which may be different pitches. The fifth landing zone 410-5 may also include mixed pitch conductive contacts having a different footprint than the footprint of the sixth landing zone.

In some instances, a landing zone can correspond to the X-Y dimensions of a particular die. For example, fourth landing zone 410-4 may have X-Y dimensions corresponding to the X-Y dimensions of the particular die to be coupled to die 400 at the fourth conductive contacts 404-4. As illustrated for the embodiment of FIG. 3, die 400 may have an X-Y area that is larger than the X-Y area of individual ones of dies to be coupled at the landing zones 410.

Any suitable techniques may be used to manufacture the microelectronic assemblies disclosed herein. For example, FIGS. 4A-4E are side, cross-sectional views of various stages in an example process for manufacturing the microelectronic assembly of FIG. 1, in accordance with various embodiments. Although the operations discussed below with regard to FIGS. 4A-4E (and others of the accompanying drawings representing manufacturing processes) are illustrated in a particular order, these operations may be performed in any suitable order. Additionally, although particular assemblies are illustrated in FIGS. 4A-4E (and others of the accompanying drawings representing manufacturing processes), the operations discussed below with reference to FIGS. 4A-4E may be used to form any suitable assemblies. In some embodiments, microelectronic assemblies manufactured in accordance with the process of FIGS. 4A-4E may have DTD interconnects 140 that may be non-solder interconnects (e.g., metal-to-metal interconnects or anisotropic conductive material interconnects). In the embodiment of FIGS. 4A-4E dies 102/130 may first be assembled into a "composite die," and then the composite die may be coupled to the package substrate 160. In general, a composite die may refer to a semiconductor structure in which multiple dies may be coupled together and assembled such that the assembly can be treated as a single die. In particular, the assembly may have a planar surface with conductive contacts for first-level interconnects. This approach may allow for tighter tolerances in the formation of DTD interconnects 140, and may be particularly desirable for integrating relatively small dies into a composite die assembly.

FIG. 4A illustrates an assembly 500 including the die 102. The die 102 is "upside down" in the sense that conductive contacts 116 and 118 at the first face 104 of die 102 are facing up. In some embodiments, the die 102 in the assembly 500 may be included in a wafer (not shown) that includes multiple copies of the die 102, while in other embodiments, the die 102 may be singulated from other dies 102 before inclusion in the assembly 500.

FIG. 4B illustrates an assembly 502 subsequent to coupling dies 130-1, 130-2, and 130-3 to die 102. In particular for the assembly 502, conductive contacts 136-1 at the first face 132-1 of die 130-1 may be coupled to conductive contacts 118-1 at the first face 104 of die 102 (e.g., via DTD interconnects 140-1). Conductive contacts 136-2 at the first face 132-2 of die 130-2 may be coupled to conductive contacts 118-2 at the first face 104 of die 102 (e.g., via DTD interconnects 140-2). Conductive contacts 136-3 at the first face 132-3 of die 130-3 may be coupled to conductive contacts 118-1 at the first face 104 of die 102 (e.g., via DTD interconnects 140-3). Any suitable technique may be used to form the DTD interconnects 140 of the assembly 502, such as metal-to-metal attachment techniques, solder techniques, or anisotropic conductive material techniques. In some embodiments, DTD interconnects 140 may be formed using die-to-die or die-to-wafer bonding techniques. For example, when the assembly 500 includes a wafer of multiple ones of the dies 102, the dies 130 may be attached to the die 102 using one or more die-to-wafer bonding operations. In still some embodiments, dies 130-1/130-2/130-3 may be redistributed on a carrier using an adhesive and DTD interconnects 140 may be formed using wafer-to-wafer bonding techniques. Individual ones of dies 130 may include a die substrate 139 extending from the second face 134 of the dies 130. The die substrate 139-1/139-2/139-3 may range in thickness from 10 microns to 780 microns. Underfill material 150 may be applied between individual ones of dies 130-1/130-2/130-3 and die 102 using any suitable technique.

FIG. 4C illustrates an assembly 504 subsequent to removing the die substrates 139 from individual ones of dies 130. Any suitable technique may be used to remove the die substrates including, but not limited to, chemical mechanical polishing (CMP), grinding, etching, debonding, or peeling, among others.

Figure 4D:
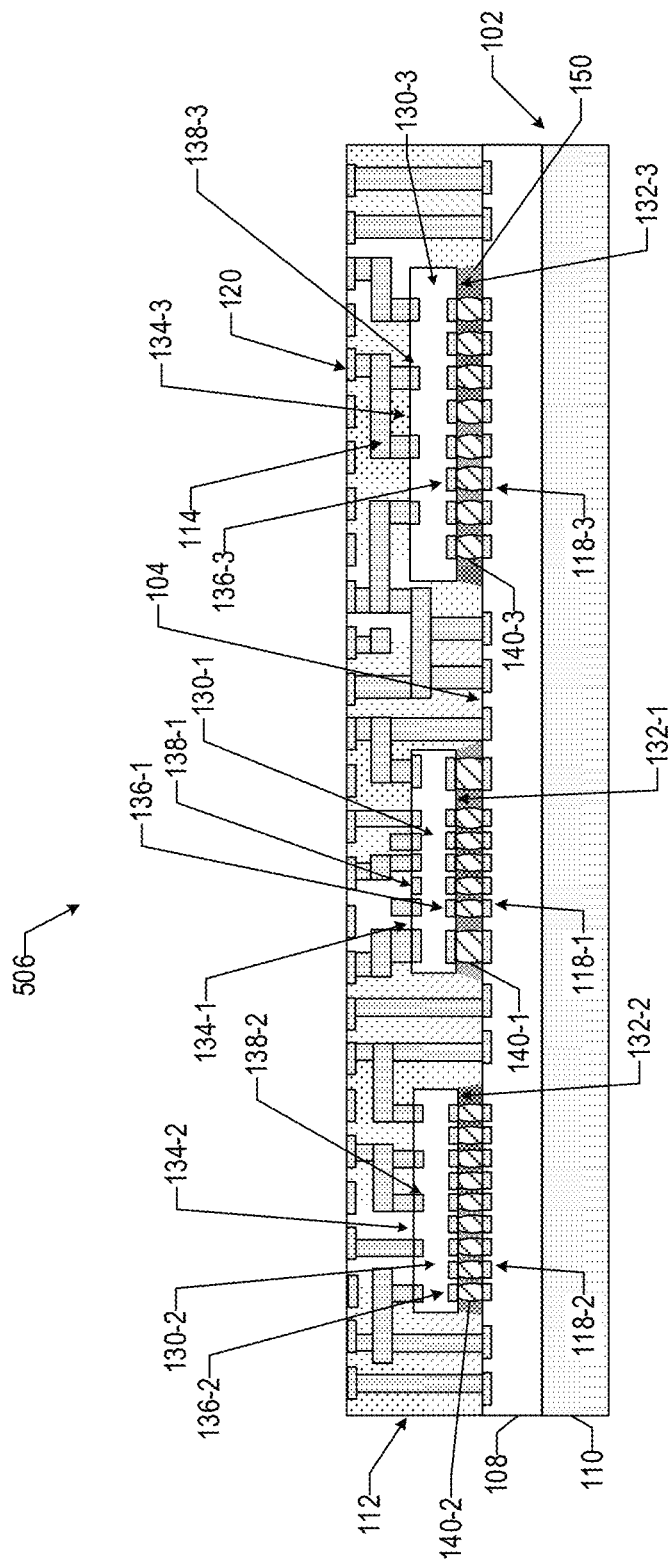

FIG. 4D illustrates an assembly 506 subsequent to forming the redistribution layer 112 including interconnect structures 114 extending between the conductive contacts 116 at the first face 104 of die 102 and the conductive contacts 120 of the redistribution layer 112 and extending between conductive contacts 138 at the second face 134 of individual ones of dies 130 and the conductive contacts 120 of the redistribution layer 112. Any suitable technique may be used to form the redistribution layer 112 including, but not limited to building up interconnect structures 114 by laminating or spinning on a dielectric material, and creating conductive vias and lines by laser drilling, lithography and plating to provide DTD interconnects, fan-in interconnects, and/or fan-out interconnects among dies 102/130 and/or between dies 102/130 and conductive contacts 120 of the redistribution layer. In some embodiments, the assembly 506 may take the form of a composite die.

Figure 4E:
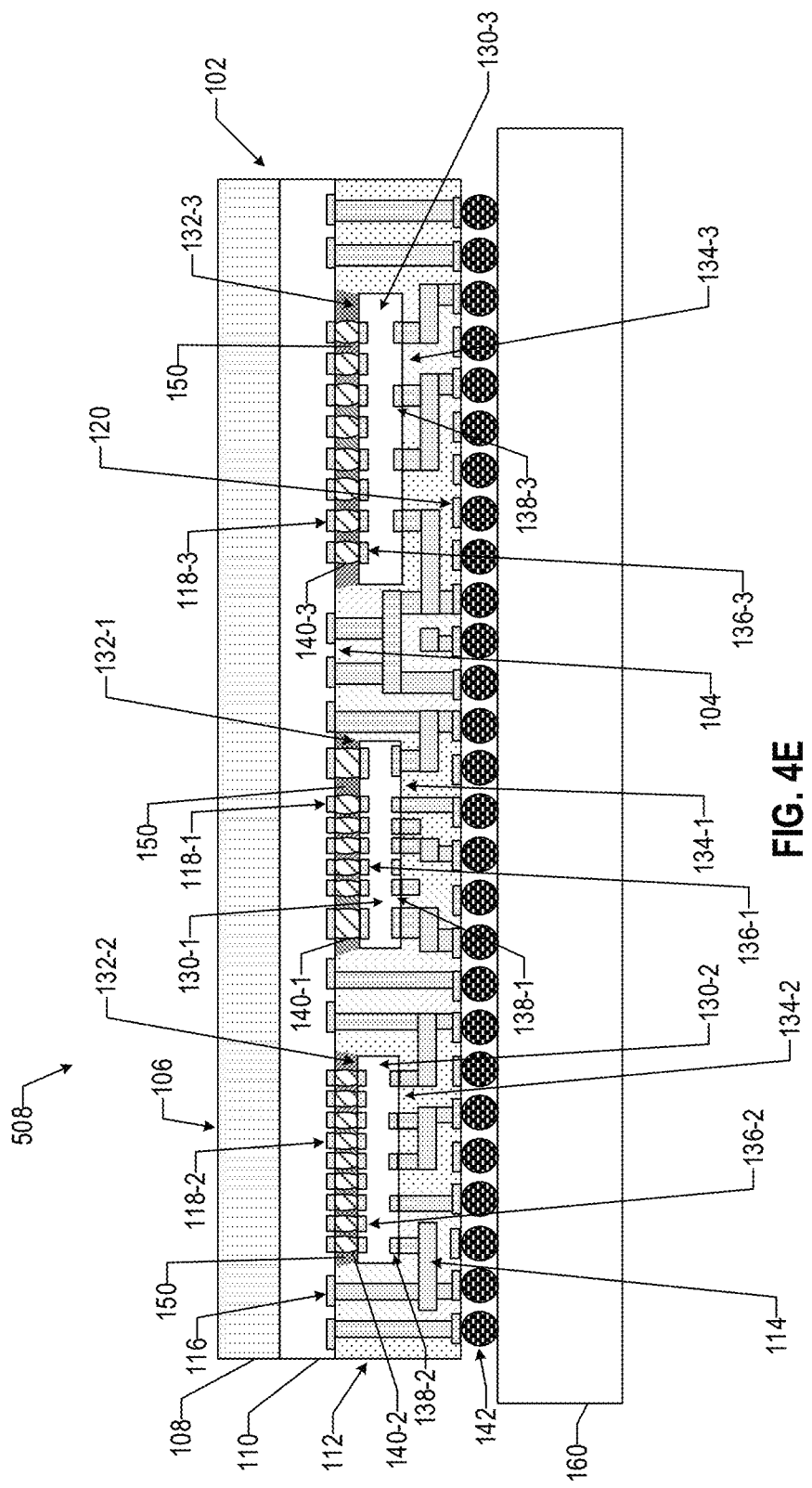

FIG. 4E illustrates an assembly 508 subsequent to "flipping" the assembly 506 of FIG. 4D and coupling the assembly to the package substrate 160 using the first-level interconnects 142. The first-level interconnects may take any of the forms disclosed herein (e.g., solder interconnects or anisotropic conductive material interconnects), and any suitable techniques may be used to form the first-level interconnects (e.g., a mass reflow process or a thermal compression bonding process). The assembly 508 may take the form the microelectronic assembly 100 of FIG. 1.

Figure 5:
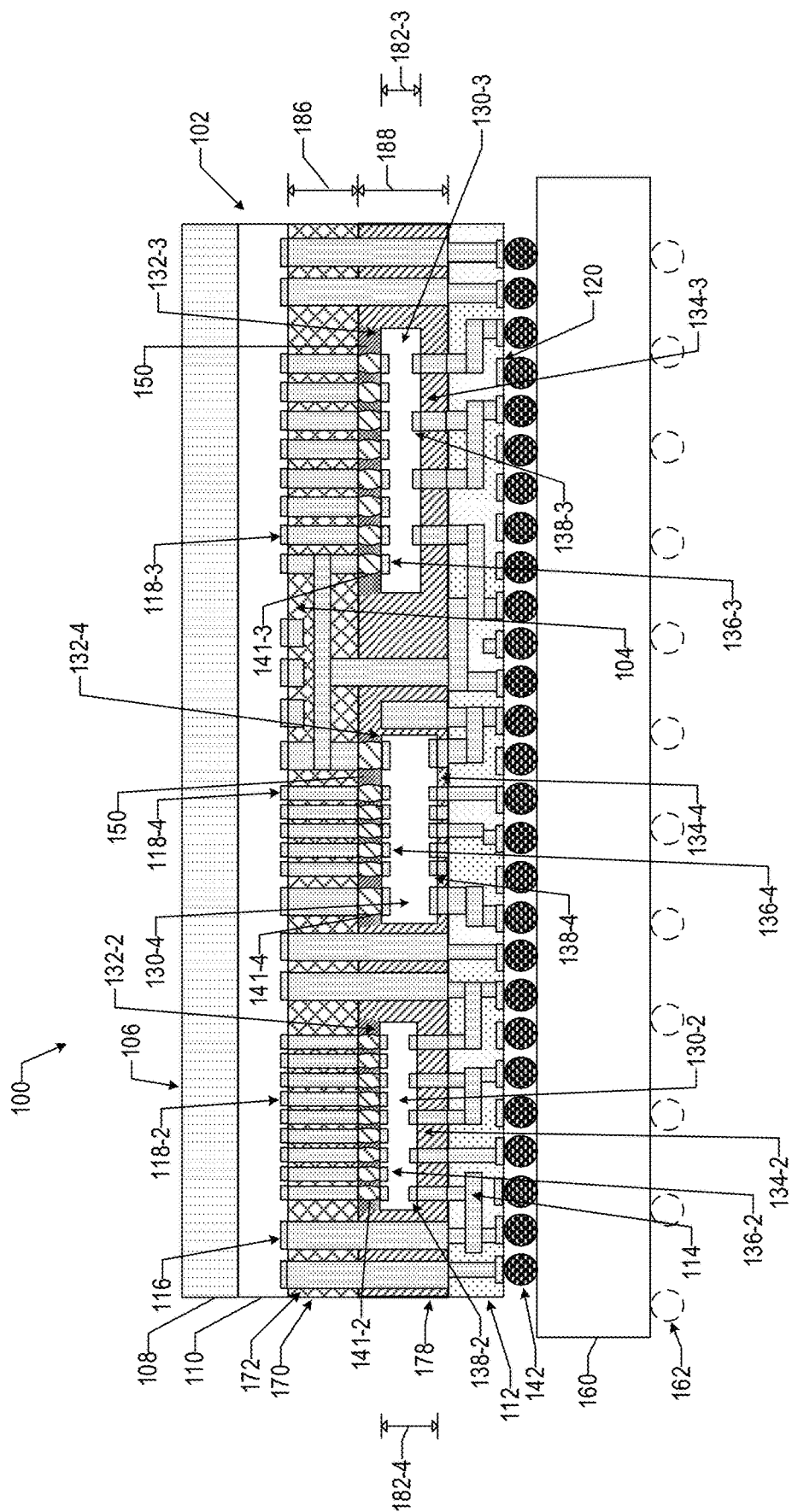
FIG. 5 is a side, cross-sectional view of another example microelectronic assembly, in accordance with various embodiments, in accordance with various embodiments.

As noted above, double-sided dies 130 coupled to die 102 for the microelectronic assembly 100 may have different thicknesses. FIG. 5 is a side, cross-sectional view of a microelectronic assembly 100 sharing a number of elements with FIG. 1 but including a first insulating layer 170, a second insulating layer 178, and a double-sided die 130-4. In various embodiments, interconnect structures 172 may be included in the first insulating layer 170 and the second insulating layer 178 to provide electrical interconnections among the dies 102/130, between the dies 102/130 and the RDL 112, or any combination thereof similar to interconnect structures 114 of the RDL 112. For example, interconnect structures 172 may be formed vertically or laterally (e.g., formed as conductive lines or vias). In some embodiments, interconnect structures 172 may be included in the first insulating layer 170 to electrically interconnect sets of conductive contacts 118 at the first face 104 of die 102 and sets of conductive contacts 136 at the first face 132 of individual ones of double-sided dies 130 (e.g., via interconnects 141). In some embodiments, interconnect structures 172 may be included in the first insulating layer to interconnect various ones of double-sided dies 130 (e.g., to interconnect double-sided dies 130-4 and 130-3, as shown in the embodiment of FIG. 5). Interconnect structures 172 may also be included in the second insulating layer 178 to provide electrical interconnections horizontally or vertically as discussed herein.

For the embodiment of FIG. 5, double-sided die 130-4 may have a thickness 182-4 that is different than the thickness 182-3 of double-sided die 130-3. The second insulating layer 178 may be formed to a thickness 188 to account for topology differences (e.g., different distances of the second face 134 of each die 130 from the first insulating layer 170 due to die thickness differences) among individual ones of double-sided dies 130 coupled to the die 102 via the first insulating layer 170.

In various embodiments, the first insulating layer 170 and the second insulating layer 178 may be composed of dielectric materials, mold materials, epoxy materials (e.g., glass reinforced epoxy matrix materials, epoxy build-up films, or the like), polyimide materials, or oxide-based materials (e.g., silicon dioxide or spin on oxide). In various embodiments, the first insulating layer 170 may range in thickness 186 from 1 micron to 40 microns. In some embodiments, finer pitch conductive contacts may be associated with thinner insulating layers being formed for a microelectronic assembly while coarser pitch conductive contacts may be associated with thicker insulating layers being formed for a microelectronic assembly 100. The thickness 188 of the second insulating layer 178 may vary depending on the thickness of dies 130 included in the microelectronic assembly. At a minimum, the thickness 188 of the second insulating layer 178 may be at least as thick as the distance from the surface of the first insulating layer for the thickest double-sided die 130 plus its interconnect distance that may be coupled to the first insulating layer 170.

Any suitable techniques may be used to manufacture the microelectronic assembly 100 of FIG. 5. For example, FIGS. 6A-6G are side, cross-sectional views of various stages in an example process for manufacturing the microelectronic assembly of FIG. 5, in accordance with various embodiments.

FIG. 6A illustrates an assembly 700 including the die 102. The die 102 is "upside down" in the sense that conductive contacts 116 and 118 at the first face 104 of die 102 are facing up. In some embodiments, die 102 may be an individual one of multiple dies of a wafer. The wafer may be composed of a semiconductor material of which die substrate 108 is composed and on which circuitry 110 may be formed.

Figure 6B:
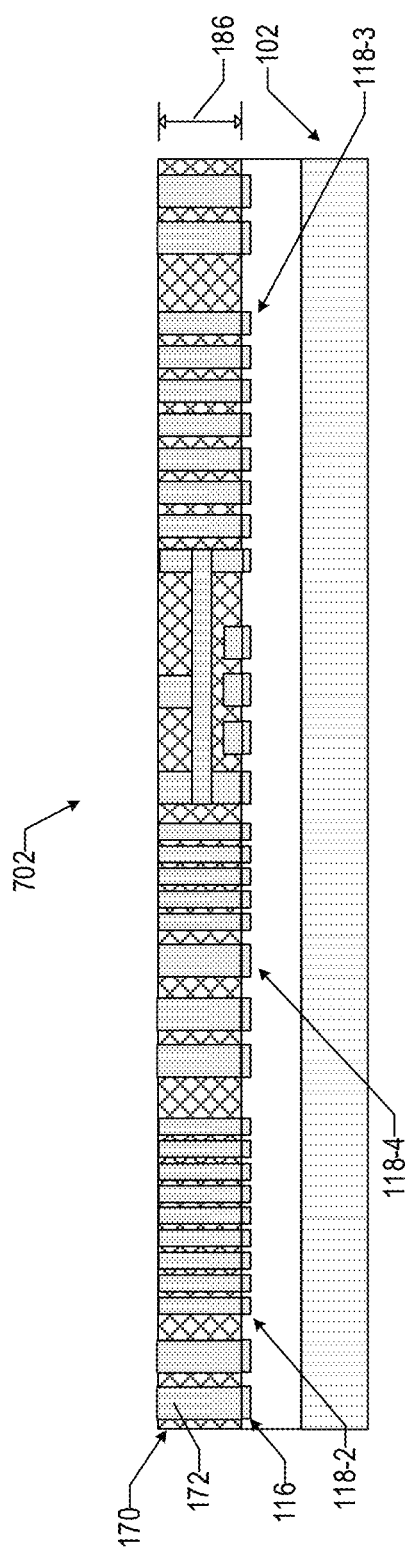

FIG. 6B illustrates an assembly 702 subsequent to forming the first insulating layer 170 including interconnect structures 172 on the first face of the die 102. The interconnect structures 172 may take the form of any of the embodiments disclosed herein, and may be formed using any suitable technique. The first insulating layer 170 may take the form of any of the embodiments disclosed herein, and may be formed using any suitable technique.

Figure 6C:
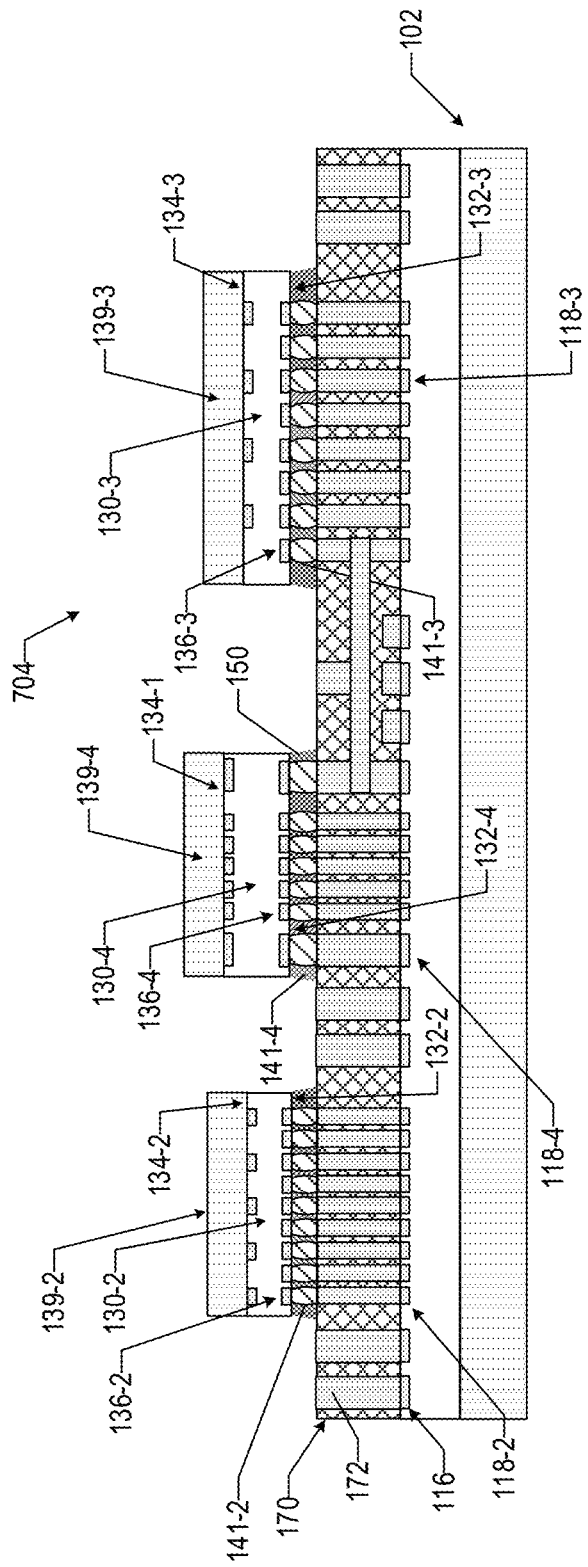

FIG. 6C illustrates an assembly 704 subsequent to coupling dies 130-2, 130-3, and 130-4 to die 102. In particular for the assembly 704, conductive contacts 136-4 at the first face 132-4 of the die 130-4 may be coupled to corresponding interconnect structures 172 of the first insulating layer 170 (e.g., via interconnects 141-4). Conductive contacts 136-2 at the first face 132-2 of the die 130-2 may be coupled to corresponding interconnect structures 172 of the first insulating layer 170 (e.g., via interconnects 141-2). Conductive contacts 136-3 at the first face 132-3 of the die 130-3 may be coupled to corresponding interconnect structures 172 of the first insulating layer 170 (e.g., via DTD interconnects 141-3). Any suitable technique as discussed herein may be used to form the interconnects 141 of the assembly 704, such as metal-to-metal attachment techniques, solder techniques, or anisotropic conductive material techniques. Underfill material 150 may be applied between individual ones of dies 130-2/130-3/130-4 and the first insulating layer 170 using any suitable technique.

Figure 6D:
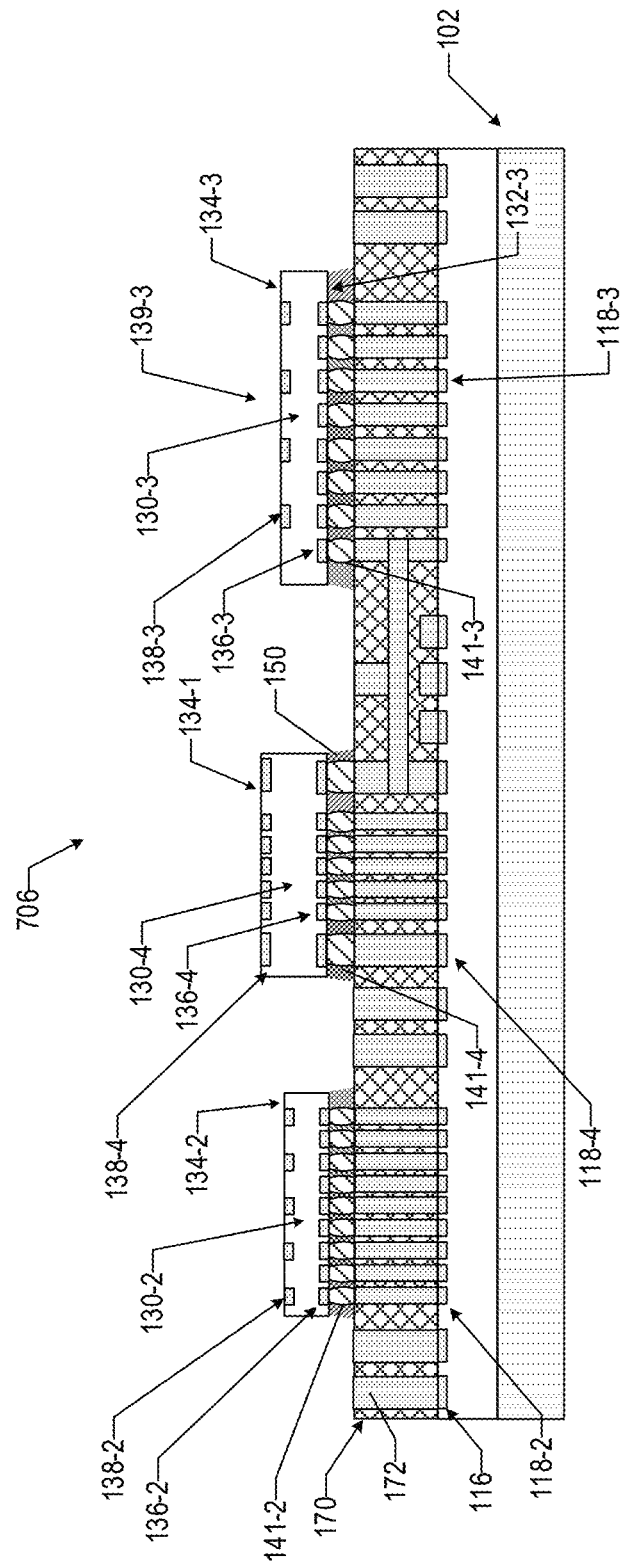

FIG. 6D illustrates an assembly 706 subsequent to removing the die substrates 139 from individual ones of dies 130. Any suitable technique may be used to remove the die substrates as disclosed herein. Depending on the size of the dies and the manufacturing equipment, the thin dies 130 maybe placed directly on the substrates without the need for the carrier die/substrate.

Figure 6E:
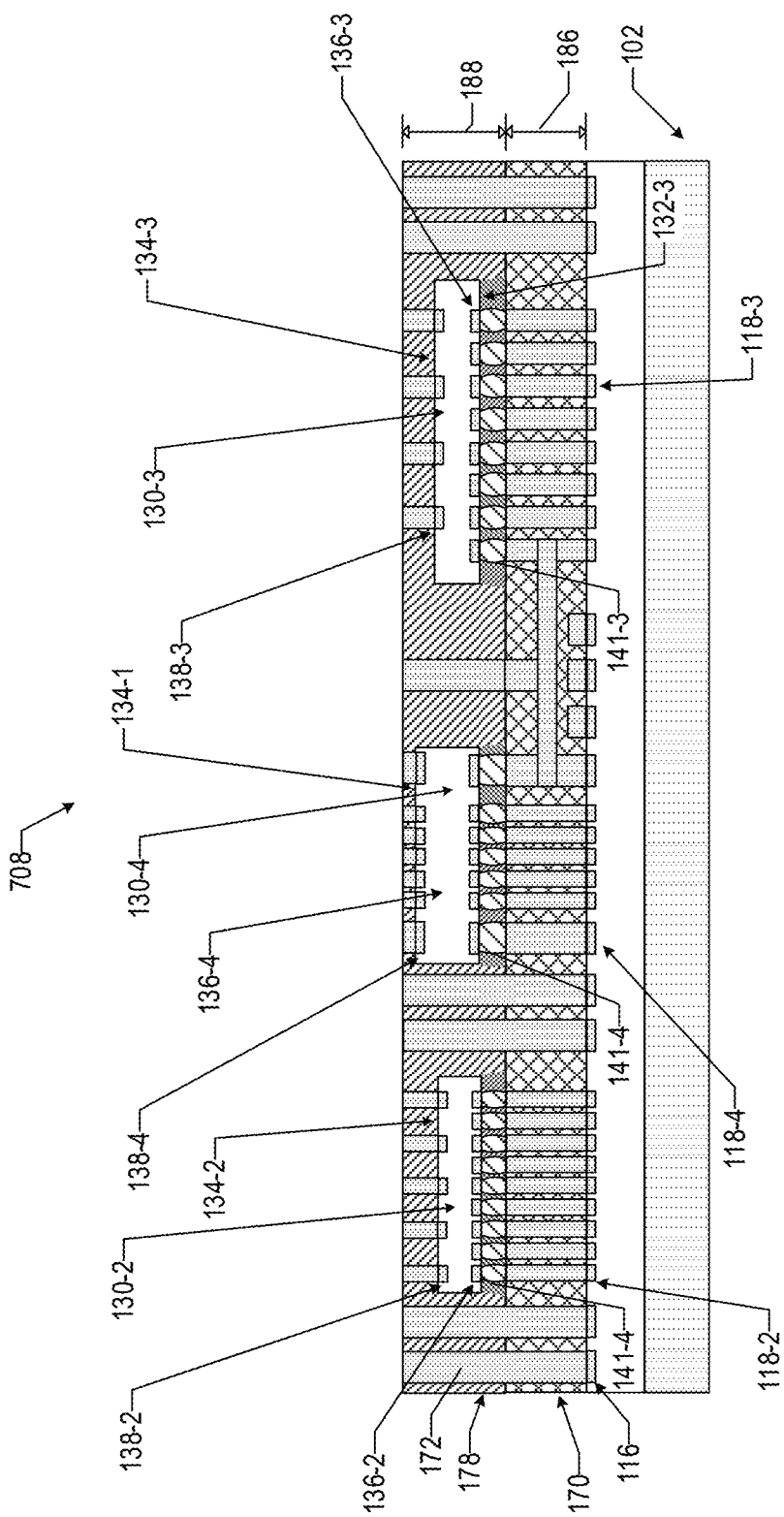

FIG. 6E illustrates an assembly 708 subsequent to forming the second insulating layer 178 including interconnect structures 172 over the first insulating layer 170 and over double-sided dies 130. The second insulating layer 178 may take the form of any of the embodiments disclosed herein, and may be formed using any suitable technique. For example, in some embodiments, the interconnect structures 172 may be encapsulated in insulating material by laminating or spinning on the insulating material and an optional planarizing process may be performed on the insulating material (e.g., if needed to reduce the height of the second insulating layer to be equal to the desired thickness 188).

Figure 6F:
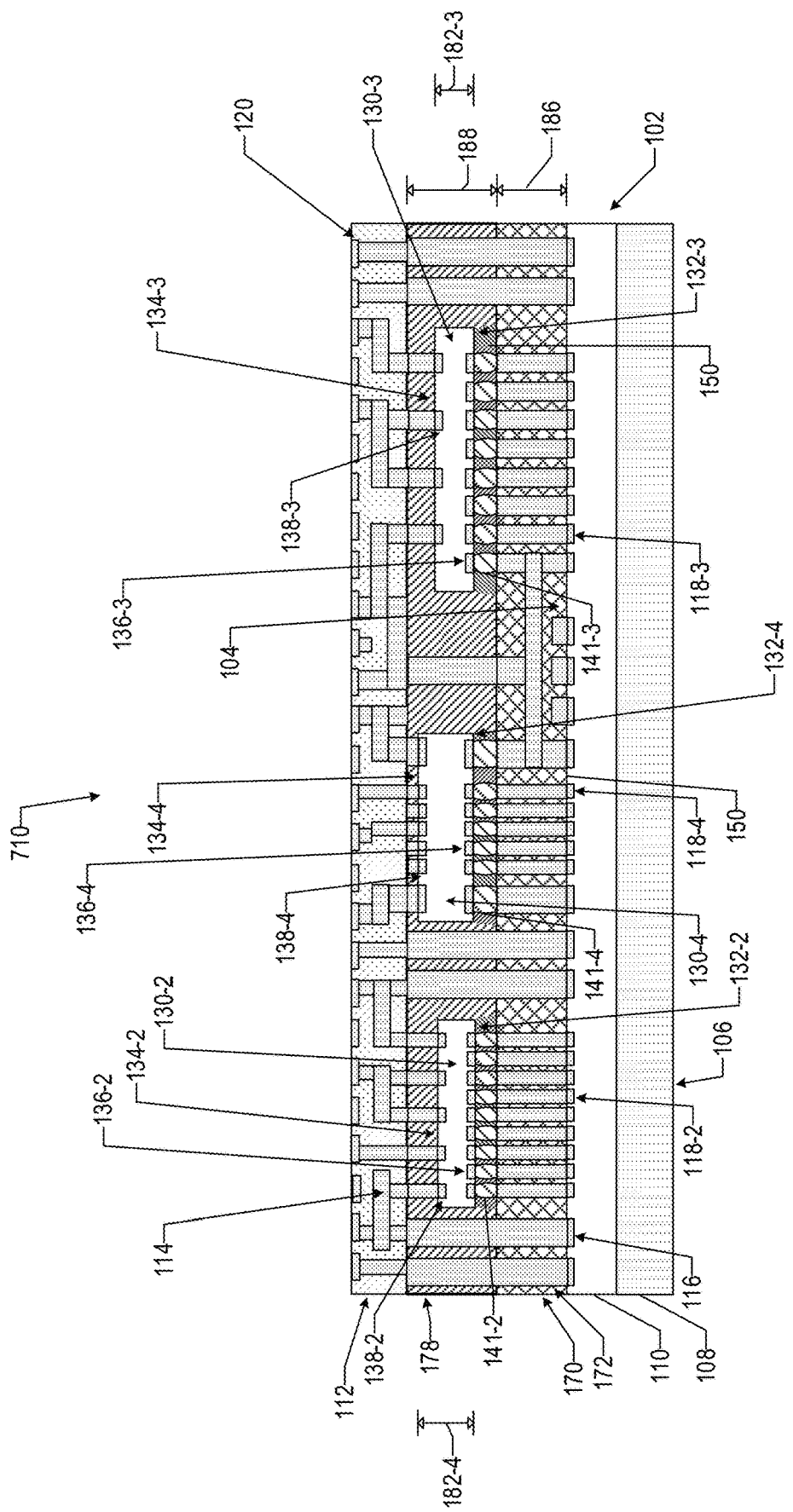

FIG. 6F illustrates an assembly 710 subsequent to forming the redistribution layer 112 including interconnect structures 114 and conductive contacts 120 on the interconnect structures 172. Any suitable technique may be used to form the redistribution layer 112 as discussed herein.

Figure 6G:
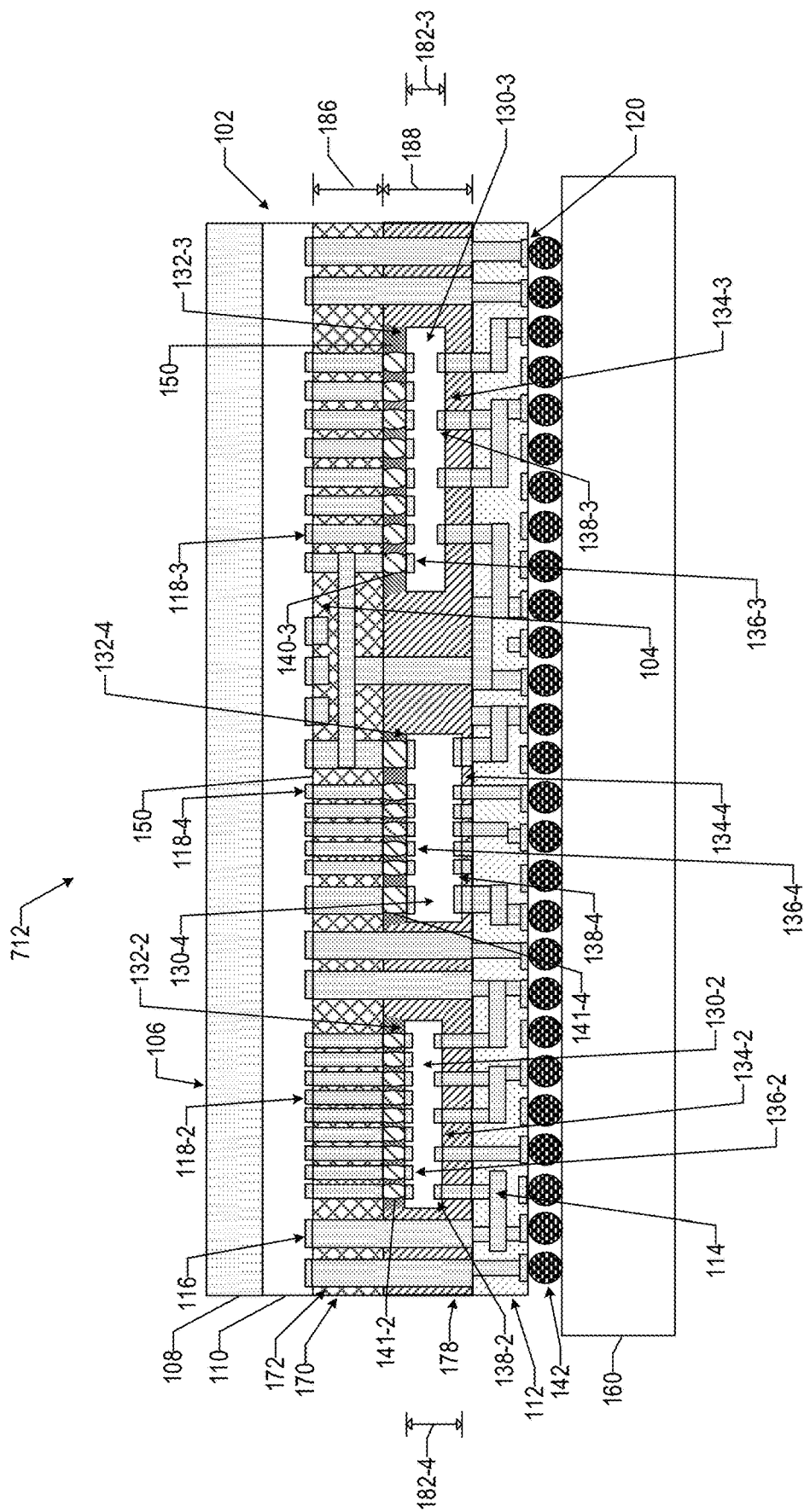

FIG. 6G illustrates an assembly 712 subsequent to "flipping" the assembly 710 of FIG. 6F and coupling the assembly to the package substrate 160 using first-level interconnects 142. The first-level interconnects may take any of the forms disclosed herein (e.g., solder interconnects or anisotropic conductive material interconnects), and any suitable techniques may be used to form the first-level interconnects (e.g., a mass reflow process or a thermal compression bonding process). The assembly 712 may take the form of the microelectronic assembly 100 of FIG. 5.

Figure 7:
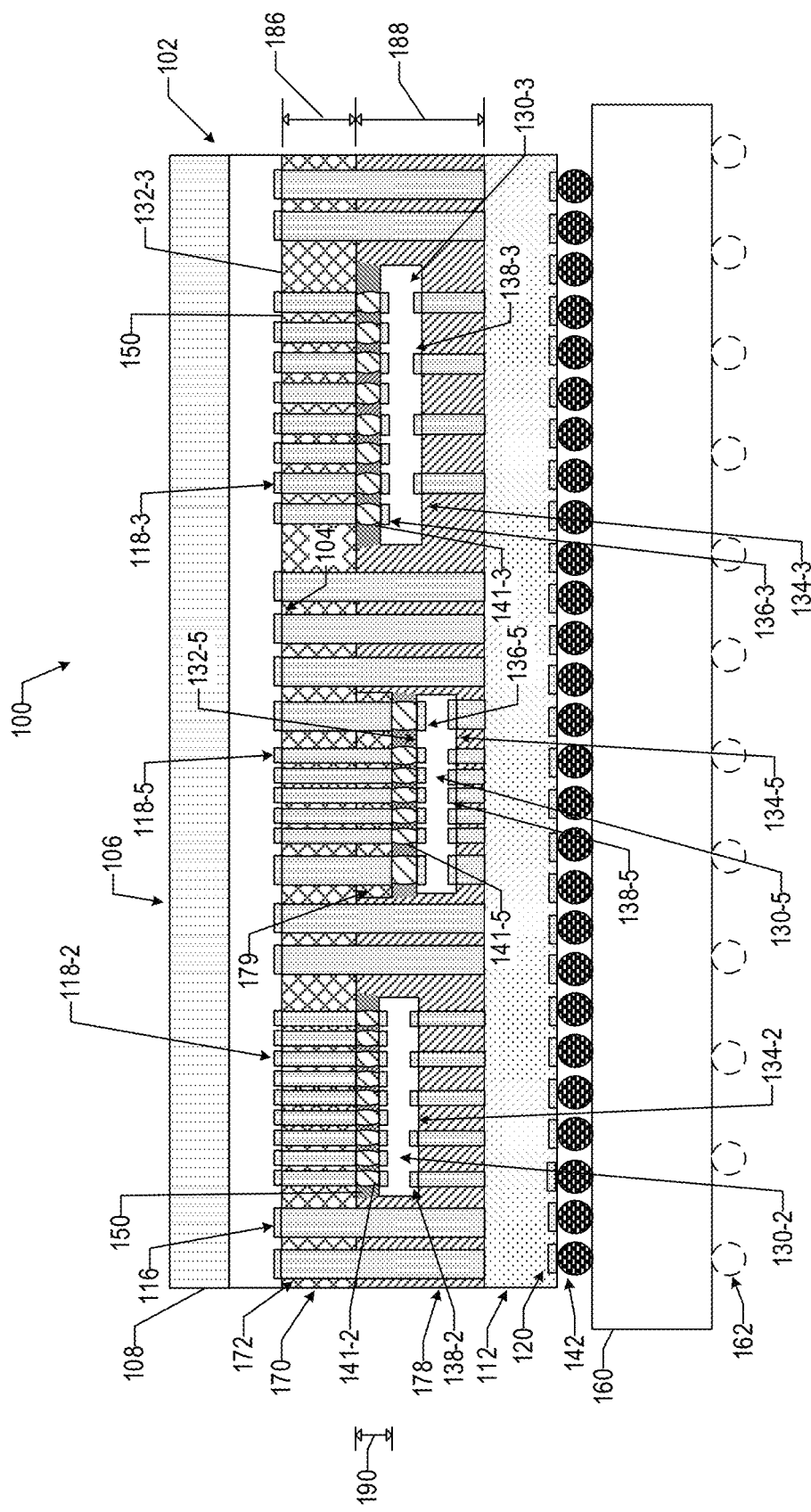
FIG. 7 is a side, cross-sectional view of another example microelectronic assembly, in accordance with various embodiments.

Beyond integrating double-sided dies of different thicknesses into the microelectronic assembly, double-sided dies 130 may be integrated into the assembly on different planes or thicknesses of insulating material. FIG. 7 is a side, cross-sectional view of a microelectronic assembly 100 sharing a number of elements with FIGS. 1 and 5 but further including a third insulating layer 179 between the first insulating layer 170 and the second insulating layer 178 and a double-sided die 130-5 electrically interconnected to the die 102. In various embodiments, interconnect structures 172 may be included in the third insulating layer 179 to provide electrical interconnections as discussed herein (e.g., to electrically interconnect the set of conductive contacts 118-5 at the first face 104 of die 102 and to the set of conductive contacts 136-5 at the first face 132-5 of double-sided die 130-5 via interconnects 141-5). The third insulating layer 179 may have a thickness 190, which may range between 1 micron and 40 microns. Thus, dies 130 can be electrically coupled to die 102 and/or to each other on two distinct planes for the embodiment of FIG. 7. Any suitable techniques may be used to manufacture the microelectronic assembly 100 of FIG. 7 in which another insulating layer (e.g., third insulating layer 179) and any combination of vertical and/or lateral interconnect structures 172 may be formed therein to provide electrical interconnections as discussed herein.

The microelectronic assemblies 100 disclosed herein may be used for any suitable application. For example, in some embodiments, a microelectronic assembly 100 may be used to provide an ultra-high density and high bandwidth interconnect for field programmable gate array (FPGA) transceivers and III-V amplifiers. Such applications may be particularly suitable for military electronics, 5G wireless communications, WiGig communications, and/or millimeter wave communications.

More generally, the microelectronic assemblies 100 disclosed herein may allow "blocks", sometimes referred to as Intellectual Property blocks "IP blocks," of different kinds of functional circuits to be distributed into different ones of the dies 102/130, instead of having all of the circuits included in a single large die, per some conventional approaches. In some such conventional approaches, a single large die would include all of these different circuits to achieve high bandwidth, low loss communication between the circuits, and some or all of these circuits may be selectively disabled to adjust the capabilities of the large die. However, because the DTD interconnects 140 of the microelectronic assemblies 100 may allow high bandwidth, low loss communication between different ones of the dies 130 and die 102, different circuits may be distributed into different dies 102/130, reducing the total cost of manufacture, improving yield, and increasing design flexibility by allowing different dies 102/130 (e.g., dies 102/130 formed using different fabrication technologies) to be readily swapped to achieve different functionality.

In another example, the die 102 in a microelectronic assembly 100 may be a processing device (e.g., a central processing unit, a graphics processing unit, a FPGA, a modem, an applications processor, etc.), and the die 130-1 may include high bandwidth memory, transceiver circuitry, and/or input/output circuitry (e.g., Double Data Rate transfer circuitry, Peripheral Component Interconnect Express circuitry, etc.). In another example, the die 102 in a microelectronic assembly 100 may be a cache memory (e.g., a third level cache memory), and one or more dies 130 may be processing devices (e.g., a central processing unit, a graphics processing unit, a FPGA, a modem, an applications processor, etc.) that share the cache memory of the die 102.

The microelectronic assemblies 100 disclosed herein may be included in any suitable electronic component. FIGS. 8-12 illustrate various examples of apparatuses that may include, or be included in, any of the microelectronic assemblies 100 disclosed herein.

Figure 8:
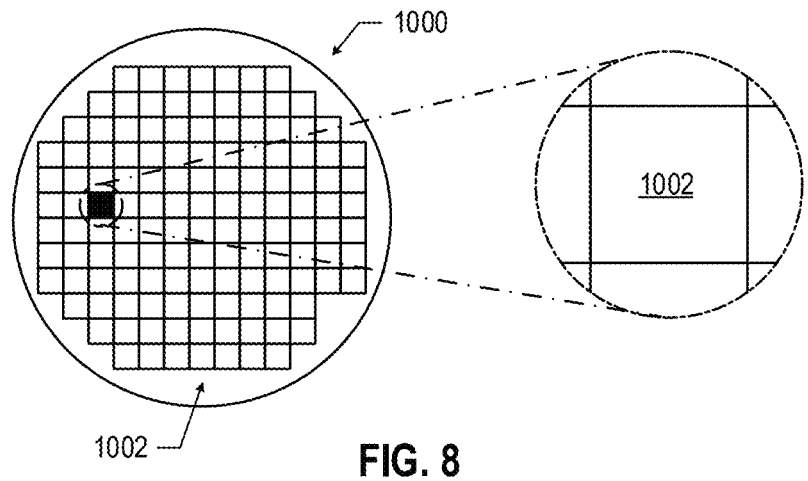
FIG. 8 is a top view of a wafer and dies that may include a microelectronic assembly, in accordance with any of the embodiments disclosed herein.

FIG. 8 is a top view of a wafer 1000 and dies 1002 that may be included in any of the microelectronic assemblies 100 disclosed herein (e.g., as any suitable ones of the dies 102/130). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 102/130 disclosed herein. The die 1002 may include one or more transistors (e.g., some of the transistors 1140 of FIG. 9, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a RAM device, such as a SRAM device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 12) or other logic that is configured to store information in the memory devices or execute instructions stored in the memory array. Various ones of the microelectronic assemblies 100 disclosed herein may be manufactured using a die-to-wafer assembly technique in which some dies 130 are attached to a wafer 1000 that include others of the dies 130, and the wafer 1000 is subsequently singulated.

Figure 9:
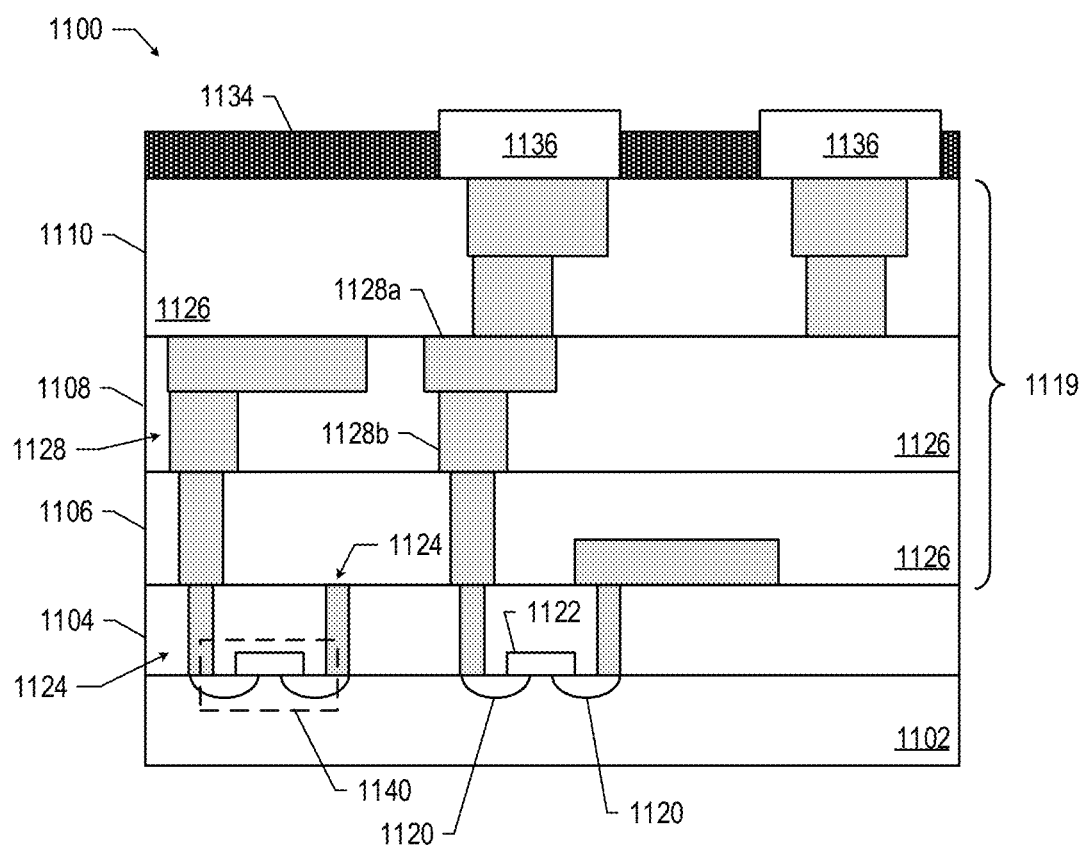
FIG. 9 is a cross-sectional side view of an integrated circuit (IC) device that may be included in a microelectronic assembly, in accordance with any of the embodiments disclosed herein.

FIG. 9 is a cross-sectional side view of an example IC device 1100 that may be included in any of the microelectronic assemblies 100 disclosed herein (e.g., in any of the dies 102/130). One or more of the IC devices 1100 may be included in one or more dies 1002 (FIG. 8). The IC device 1100 may be formed on a die substrate 1102 (e.g., the wafer 1000 of FIG. 8) and may be included in a die (e.g., the die 1002 of FIG. 8). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a SOI substructure, or the like as discussed herein. In some embodiments, the die substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an IC device 1100 may be used. The die substrate 1102 may be part of a singulated die (e.g., the dies 1002 of FIG. 9) or a wafer (e.g., the wafer 1000 of FIG. 8).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the die substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 10 and may include a wide variety of other types and configurations such as planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the die substrate and two sidewall portions that are substantially perpendicular to the top surface of the die substrate. In other embodiments, at least one of the metal layers that form the gate electrode may simply be a planar layer that is substantially parallel to the top surface of the die substrate and does not include sidewall portions substantially perpendicular to the top surface of the die substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 9 as interconnect layers 1106, 1108, and 1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 9. Although a particular number of interconnect layers 1106-1110 is depicted in FIG. 9, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the die substrate 1102 upon which the device layer 1104 is formed. For example, the lines 1128a may route electrical signals in a direction in and out of the page from the perspective of FIG. 9. The vias 1128b may be arranged to route electrical signals in a direction of a plane that is substantially perpendicular to the surface of the die substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 9. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 9, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components. The conductive contacts 1136 may serve as the conductive contacts 116, 118, 136 or 138, as appropriate.

In some embodiments in which the IC device 1100 is a double-sided die (e.g., like the die 130-1), the IC device 1100 may include another metallization stack (not shown) on the opposite side of the device layer(s) 1104. This metallization stack, may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136. In other embodiments in which the IC device 1100 is a double-sided die, the IC device 1100 may include one or more TSVs through the die substrate 1102; these TSVs may make contact with the device layer(s) 1104, and may provide conductive pathways between the device layer(s) 1104 and additional conductive contacts (not shown) on the opposite side of the IC device 1100 from the conductive contacts 1136. These additional conductive contacts may serve as the conductive contacts for any of the double-sided dies discussed herein, as appropriate. Example details of one example type of a double-sided IC device are discussed in further detail in FIG. 10.

Figure 10:
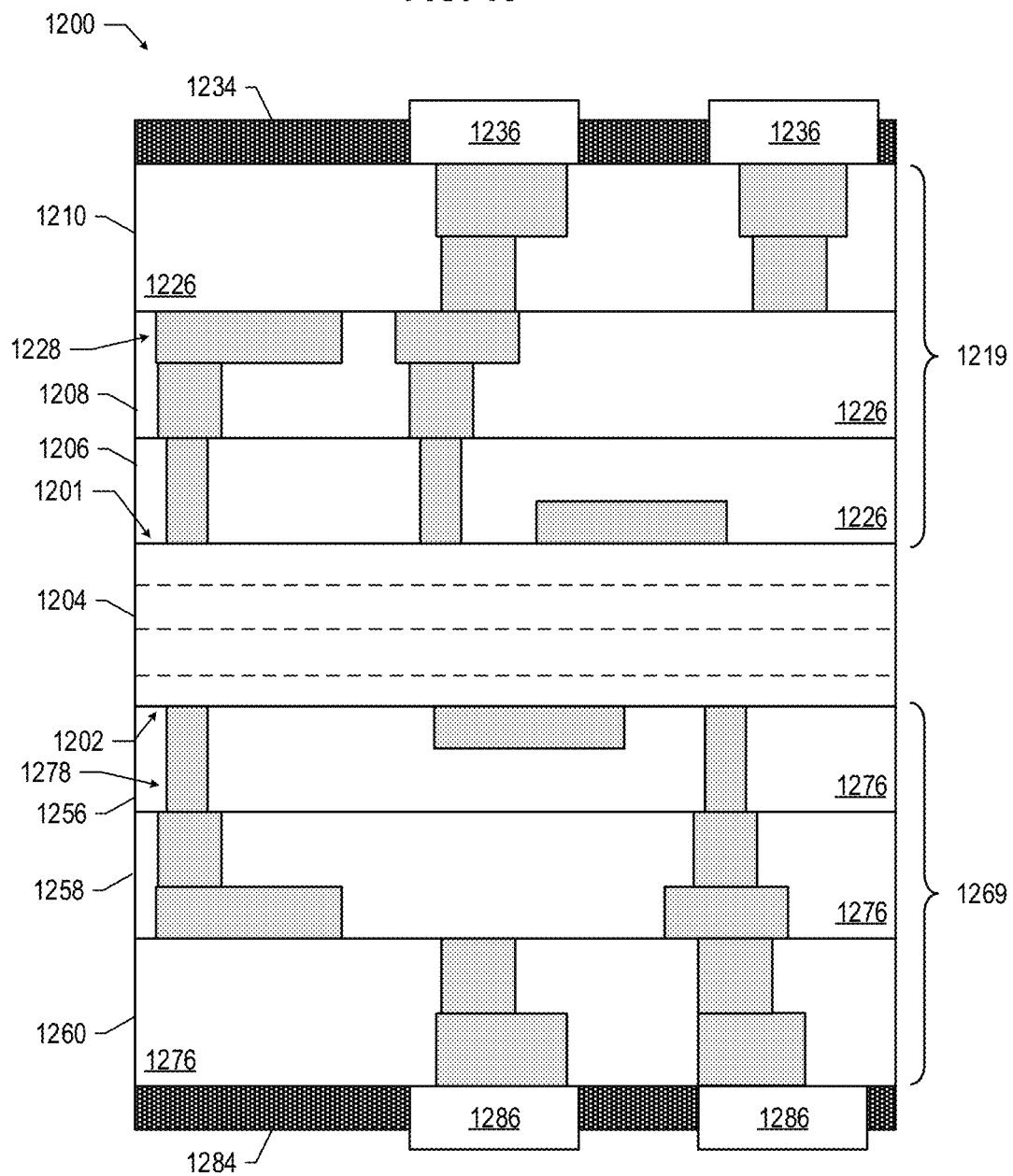
FIG. 10 is a cross-sectional side view of one example type of a double-sided IC device that may be included in a microelectronic assembly, in accordance with any of the embodiments disclosed herein.

FIG. 10 is a side, cross-sectional view of one example type of a double-sided IC device 1200 that may be included in any of the microelectronic assemblies 100 disclosed herein (e.g., in any of the dies 102/130). One or more of the double-sided IC devices 1200 may be included in one or more dies 1002 (FIG. 8). The double-sided IC device 1200 may be composed of semiconductor material systems including, for example, n-type or p-type materials systems (or a combination of both). In some embodiments, the IC device may be composed of alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the double-sided IC device 1200.

The double-sided IC device 1200 may include one or more device layers 1204. The device layers 1204 may include features of one or more transistors (e.g., as discussed in FIG. 9) and/or any other active and/or passive circuitry as may be desired by a device manufacturer.

Electrical signals, such as power and/or input/output (I/O) signals, may be routed to and/or from the devices of the device layers 1204 through one or more interconnect layers disposed on opposing sides of the device layers 1204 (illustrated in FIG. 10 as first interconnect layers 1206, 1208, and 1210 on a first side 1201 of the device layers and second interconnect layers 1256, 1258, and 1260 on an opposing second side 1202 of the device layers 1204). For example, electrically conductive features of the device layers 1204 may be electrically coupled with the first interconnect structures 1228 of the first interconnect layers 1206-1210 and/or with the second interconnect structures 1278 of the second interconnect layers 1256-1260. The one or more first interconnect layers 1206-1210 may form a first metallization stack (e.g., an ILD stack) 1219 and the one or more second interconnect layers 1256-1260 may form a second metallization stack 1269 of the double-sided IC device 1200.

The first interconnect structures 1228 may be arranged within the first interconnect layers 1206-1210 and the second interconnect structures 1278 may be arranged within the second interconnect layers 1256-1260 to route electrical signals according to a wide variety of designs (in particular, the arrangement is not limited to the particular configuration of the first interconnect structures 1228 and the second interconnect structures 1278 depicted in FIG. 10). Although a particular number of first interconnect layers 1206-1210 and a particular number of second interconnect layers 1256-1260 are depicted in FIG. 10, embodiments of the present disclosure include IC devices having more or fewer first and/or second interconnect layers than depicted. Further, the particular number of first interconnect layers and second interconnect layers on opposing sides of the device layers 1204 may be the same or different from each other.

In some embodiments, the first interconnect structures 1228 and/or the second interconnect structures 1278 may include lines and/or vias as discussed herein filled with an electrically conductive material such as a metal. The first interconnect layers 1206-1210 may include a first dielectric material 1226 disposed between the first interconnect structures 1228, as shown in FIG. 10. In some embodiments, the first dielectric material 1226 disposed between the first interconnect structures 1228 in different ones of the first interconnect layers 1206-1210 may have different compositions; in other embodiments, the composition of the first dielectric material 1226 between different first interconnect layers 1206-1210 may be the same. The second interconnect layers 1256-1260 may include a second dielectric material 1276 disposed between the second interconnect structures 1278, as shown in FIG. 10. In some embodiments, the second dielectric material 1276 disposed between the second interconnect structures 1278 in different ones of the second interconnect layers 1256-1260 may have different compositions; in other embodiments, the composition of the second dielectric material 1276 between different second interconnect layers 1256-1260 may be the same. In some embodiments, the composition of the first dielectric material 1226 and the second dielectric material 1276 may be different; in other embodiments, the composition of the first dielectric material 1226 and the second dielectric material 1276 may be the same. The first interconnect layers 1206-1210 and the second interconnect layers 1256-1260 may be formed using any techniques as discussed herein (e.g., composed of M1-M3 layers, etc.).

The double-sided IC device 1200 may include a first solder resist material 1234 (e.g., polyimide or similar material) and one or more first conductive contacts 1236 formed on the first interconnect layers 1206-1210. The double-sided IC device 1200 may include a second solder resist material 1284 (e.g., polyimide or similar material) and one or more second conductive contacts 1286 formed on the second interconnect layers 1256-1260. In some embodiments, the composition of the first solder resist material 1234 and the second solder resist material 1284 may be the same; in other embodiments, the composition of the first solder resist material 1234 and the second solder resist material 1284 may be different.

In FIG. 10, the first conductive contacts 1236 and the second conductive contacts 1286 are illustrated as taking the form of bond pads. The first conductive contacts 1236 may be electrically coupled with the first interconnect structures 1228 and the second conductive contacts 1286 may be electrically coupled with the second interconnect structures 1278. The double-sided IC device 1200 may include additional or alternate structures to route the electrical signals from the first interconnect layers 1206-1210 and/or the second interconnect layers 1256-1260; for example, the first conductive contacts 1236 and/or the second conductive contacts 1286 may include other analogous features (e.g., posts) that route the electrical signals to external components. The conductive contacts 1236 and/or 1286 may serve as the conductive contacts 136 or 138, as appropriate.

Figure 11:
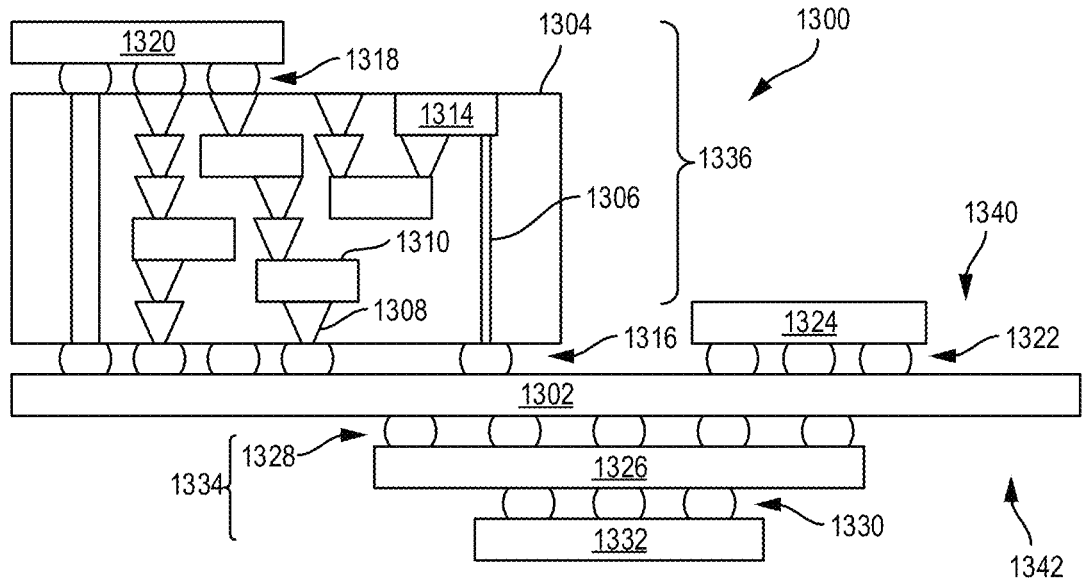
FIG. 11 is a cross-sectional side view of an IC device assembly that may include a microelectronic assembly, in accordance with any of the embodiments disclosed herein.

FIG. 11 is a cross-sectional side view of an IC device assembly 1300 that may include any of the microelectronic assemblies 100 disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. Any of the IC packages discussed below with reference to the IC device assembly 1300 may take the form of any suitable ones of the embodiments of the microelectronic assemblies 100 disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 11 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 11), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 11, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 8), an IC device (e.g., the IC device 1100 of FIG. 9 or the double-sided IC device 1200 of FIG. 10), or any other suitable component. Generally, the interposer 1304 may spread a connection to a wider pitch or reroute a connection to a different connection. For example, the interposer 1304 may couple the IC package 1320 (e.g., a die) to a set of ball grid array (BGA) conductive contacts of the coupling components 1316 for coupling to the circuit board 1302. In the embodiment illustrated in FIG. 11, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 11 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 12:
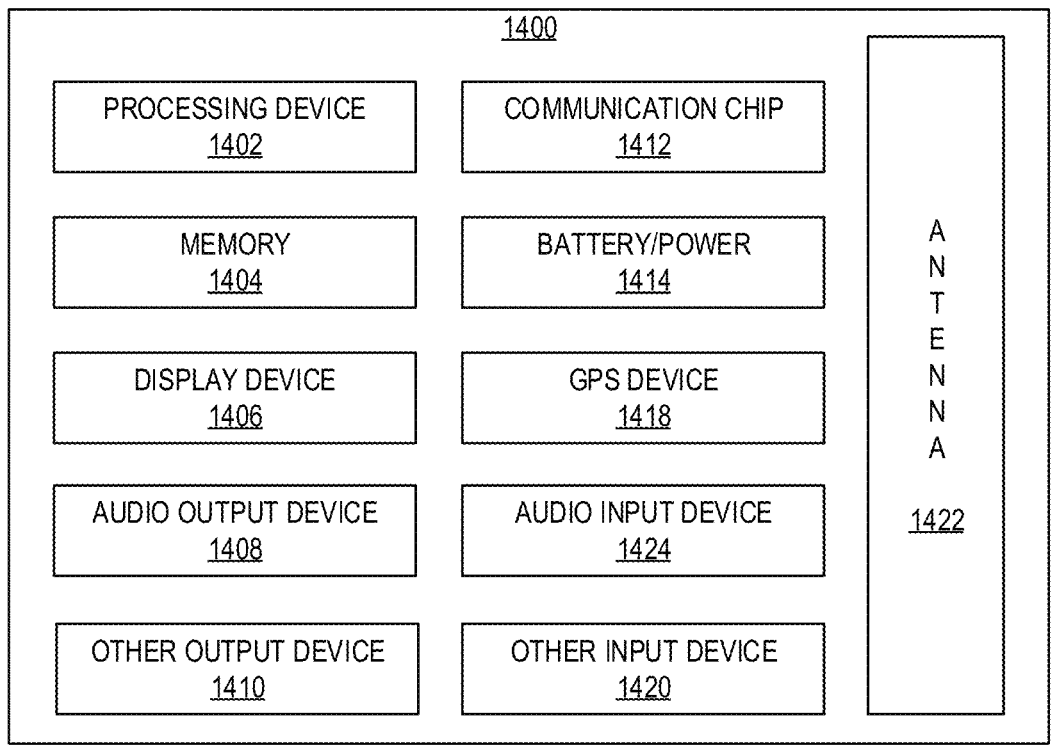
FIG. 12 is a block diagram of an example electrical device that may include a microelectronic assembly, in accordance with any of the embodiments disclosed herein.

FIG. 12 is a block diagram of an example electrical device 1400 that may include one or more of the microelectronic assemblies 100 disclosed herein. For example, any suitable ones of the components of the electrical device 1400 may include one or more of the IC device assemblies 1300, IC devices 1100, double-sided IC devices 1200 or dies 1002 disclosed herein, and may be arranged in any of the microelectronic assemblies 100 disclosed herein. A number of components are illustrated in FIG. 12 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 12, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-MRAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include a other output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include a other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1400 may be any other electronic device that processes data.

The following paragraphs provide various examples of the embodiments disclosed herein.

Example 1 is a microelectronic assembly including a first die comprising a first face and a second face; and a second die, the second die including a first face and a second face, wherein the second die further comprises a plurality of first conductive contacts at the first face and a plurality of second conductive contacts at the second face, and the second die is between first-level interconnect contacts of the microelectronic assembly and the first die.

Example 2 may include the subject matter of Example 1 and may further specify that the first die further includes: a plurality of first conductive contacts at the first face of the first die interconnected with the first-level interconnect contacts of the microelectronic assembly; and a plurality of second conductive contacts at the first face of the first die interconnected with the second die.

Example 3 may include the subject matter of Example 2 and may further specify that a set of the plurality of the second conductive contacts at the first face of the first die have a same pitch and are interconnected to the second die.

Example 4 may include the subject matter of Example 2 and may further specify that a first set of the plurality of the second conductive contacts at the first face of the first die have a first pitch, a second set of the plurality of the second conductive contacts of the first die have a second pitch, the first set and the second set are interconnected to the second die, and the first pitch and second pitch are different.

Example 5 may include the subject matter of Example 1 and may further specify that the microelectronic assembly further includes a redistribution layer (RDL), wherein the RDL comprises one or more interconnect structures and the second die is between the first die and at least a portion of the RDL.

Example 6 may include the subject matter of Example 5 and may further specify that the RDL has a thickness between 15 microns and 100 microns.

Example 7 may include the subject matter of Example 5 and may further specify that at least one of: one interconnect structure of the RDL includes a conductive pathway between at least one first conductive contact of the first die and at least one first-level interconnect contact of the microelectronic assembly; one interconnect structure of the RDL includes a conductive pathway between at least one second conductive contact of the second die and at least one first-level interconnect contact of the microelectronic assembly; one interconnect structure of the RDL includes a conductive pathway between at least one first conductive contact of the first die and at least one second conductive contact of the second die; and one interconnect structure of the RDL includes a conductive pathway between at least two second conductive contacts the second die.

Example 8 may include the subject matter of Example 1 and may further specify that the second die includes a die substrate, a metallization stack, and a device layer between the die substrate and the metallization stack, and wherein the die substrate is between a package substrate and the device layer.

Example 9 may include the subject matter of Example 1 and may further specify that the second die includes a die substrate, a metallization stack, and a device layer between the die substrate and the metallization stack, and wherein the device layer is between a package substrate and the die substrate.

Example 10 may include the subject matter of Example 1 and may further specify that the second die includes a first metallization stack, a second metallization stack, and a device layer between the first metallization stack and the second metallization stack.

Example 11 may include the subject matter of any of Examples 1-10 and may further specify that the second die is an individual one of a plurality of second dies.

Example 12 may include the subject matter of Example 11 and may further specify that at least one second die has a first thickness and at least one other second die has a second thickness that is different than the first thickness of the at least one second die.

Example 13 may include the subject matter of any of Examples 11-12 and may further include an insulating layer between the plurality of second dies and the first die.

Example 14 may include the subject matter of Example 13 and may further specify that the insulating layer has a thickness between 1 micron and 40 microns.

Example 15 may include the subject matter of any of Examples 13-14 and may further specify that at least two of the plurality of second dies are interconnected via interconnect structures of the insulating layer.

Example 16 may include the subject matter of any of Examples 13-15 and may further specify that the insulating layer is a first insulating layer, and the microelectronic assembly further comprises a second insulating layer at the between the second face of the plurality of second dies and the first-level interconnect contacts of the microelectronic assembly.

Example 17 may include the subject matter of Example 13 and may further specify that the insulating layer is a first insulating layer, and the microelectronic assembly further includes a second insulating layer between at least one second die of the plurality of second dies and the first insulating layer.

Example 18 may include the subject matter of Example 17 and may further include a third insulating layer between the second face of the plurality of second dies and the first-level interconnect contacts of the microelectronic assembly.

Example 19 may include the subject matter of Example 18 and may further specify that the first insulating layer, the second insulating layer, and the third insulating layer have different thicknesses.

Example 20 may include the subject matter of any of Examples 17-19 and may further specify that at least two of the plurality of second dies are interconnected via interconnect structures of the second insulating layer.

Example 21 may include the subject matter of any of Examples 17-20 and may further specify that at least two of the plurality of second dies are interconnected via interconnect structures of the third insulating layer.

Example 22 is a computing device including: a composite die, the composite die including: a first die; and a second die interconnected to the first die between first-level interconnect contacts of the composite die and the first die, wherein the second die further comprises conductive contacts at a first face and a second face.

Example 23 may include the subject matter of Example 22 and may further specify that the second die is an individual one of a plurality of second dies.

Example 24 may include the subject matter of Example 23 and may further specify that at least two dies of the plurality of second dies have different interconnect footprints to the first die.

Example 25 may include the subject matter of any of Examples 23-24 and may further specify that at least one second die of the plurality of second dies has an interconnect footprint to the first die at a first pitch and a second pitch that is different than the first pitch.

Example 26 may include the subject matter of any of Examples 23-25 and may further specify that at least one of: at least one second die of the plurality of second dies has a solder interconnection with the first die; at least one second die of the plurality of second dies has a non-solder interconnection with the first die; at least one second die of the plurality of second dies has an interconnection with the first die on a first layer having a first thickness; and at least one second die of the plurality of second dies has an interconnection with the first die on a first layer having a first thickness and at least one other second die of the plurality of second dies has an interconnection with the first die on a second layer having a second thickness, wherein the first layer and the second layer comprise one or more dielectric materials.

Example 27 may include the subject matter of Example 23-26 and may further specify that at least one second die of the plurality of second dies has a thickness between 10 microns and 30 microns.

Example 28 may include the subject matter of any of Examples 23-27 and may further specify that at least two second dies of the plurality of second dies are different types of devices.

Example 29 may include the subject matter of any of Examples 23-28 and may further specify that individual ones of the plurality of second dies have a X-Y area that is smaller than an X-Y area of the first die.

Example 30 may include the subject matter of any of Examples 23-29 and may further include an insulating layer between the plurality of second dies and the first die.

Example 31 may include the subject matter of Example 30 and may further specify that the insulating layer has a thickness between 1 micron and 40 microns.

Example 32 may include the subject matter of any of Examples 30-31 and may further specify that at least two of the plurality of second dies are interconnected via interconnect structures of the insulating layer.

Example 33 may include the subject matter of any of Examples 30-32 and may further specify that the insulating layer is a first insulating layer, and the microelectronic assembly further includes a second insulating layer at the between the second face of the plurality of second dies and the first-level interconnect contacts of the microelectronic assembly.

Example 34 may include the subject matter of Example 30 and may further specify that the insulating layer is a first insulating layer, and the microelectronic assembly further includes a second insulating layer between at least one second die of the plurality of second dies and the first insulating layer.

Example 35 may include the subject matter of Example 34 and may further include a third insulating layer between the second face of the plurality of second dies and the first-level interconnect contacts of the microelectronic assembly.

Example 36 may include the subject matter of Example 35 and may further specify that the first insulating layer, the second insulating layer, and the third insulating layer have different thicknesses.

Example 37 may include the subject matter of any of Examples 34-36 and may further specify that at least two of the plurality of second dies are interconnected via interconnect structures of the second insulating layer.

Example 38 may include the subject matter of any of Examples 34-37 and may further specify that at least two of the plurality of second dies are interconnected via interconnect structures of the third insulating layer.

Example 39 may include the subject matter of any of Examples 23-38 and may further specify that at least two of the plurality of second dies have different thicknesses.

Example 40 is a method of manufacturing a microelectronic assembly, including: interconnecting a second die to a first die, the first die including a first face and a second face and the second die including a first face and a second face, the second die further including a plurality of first conductive contacts at the first face and a plurality of second conductive contacts at the second face; and forming a redistribution layer, the redistribution layer comprising a plurality of conductive structures, wherein the second die is between at least a portion of the redistribution layer and the first die.

Example 41 may include the subject matter of Example 40 and may further specify that the second die is one of a plurality of second dies.

Example 42 may include the subject matter of Example 41 and may further include: forming a first layer extending from the first face of the first die, the first layer including an insulating material and a plurality of first interconnect structures in electrical contact with a plurality of conductive contacts at the first face of the first die, wherein the plurality of second dies are interconnected to the first die via the first layer.

Example 43 may include the subject matter of Example 42 and may further specify that at least one second die has a first thickness and at least one other second die has a second thickness that is different than the first thickness of the at least one second die.

Example 44 may include the subject matter of any of Examples 42-43 and may further include: forming a second layer extending from the first layer and from the second face of the plurality of second dies, the second layer comprising another insulating material and a plurality of other interconnect structures.

The invention claimed is:
1. A microelectronic assembly, comprising:
a first die having a first face and an opposing second face, the first face including first conductive contacts having a first pitch and arranged in a first pattern, second conductive contacts having a second pitch and arranged in a second pattern, and third conductive contacts having a third pitch and arranged in a third pattern, wherein the second pitch is different than the first pitch, and wherein the third pitch is different than the first pitch and the second pitch;
a second die having a first face and an opposing second face, wherein the second face of the second die includes second conductive contacts having the second pitch and arranged in the second pattern, and wherein respective ones of the second conductive contacts of the second die are electrically coupled to respective ones of the second conductive contacts of the first die;
a third die, having a first face and an opposing second face, wherein the second face of the third die includes third conductive contacts having the third pitch and arranged in the third pattern, and wherein respective ones of the third conductive contacts of the third die are electrically coupled to respective ones of the third conductive contacts of the first die; and
a redistribution layer (RDL) having a first face and an opposing second face, wherein the RDL comprises one or more interconnect structures, wherein the RDL is electrically coupled to the first conductive contacts on the first die, and wherein the second and third dies are between the first die and at least a portion of the RDL.

2. The microelectronic assembly of claim 1, further comprising:
a substrate at the first face of the RDL and electrically coupled to conductive contacts on the first surface of the RDL, wherein the first conductive contacts of the first die are electrically coupled to the substrate by conductive pathways in the RDL and one or more of the conductive contacts on the first surface of the RDL.

3. The microelectronic assembly of claim 2, wherein the second die includes a die substrate, a metallization stack, and a device layer between the die substrate and the metallization stack, and wherein the die substrate is between the substrate and the device layer.

4. The microelectronic assembly of claim 2, wherein the second die includes a die substrate, a metallization stack, and a device layer between the die substrate and the metallization stack, and wherein the device layer is between the substrate and the die substrate.

5. A microelectronic assembly, comprising:
a redistribution layer (RDL) having a first face and an opposing second face;
a first die at the second face of the RDL, the first die having a first face and an opposing second face, the first face including first conductive contacts having a first pitch and arranged in a first pattern, second conductive contacts having a second pitch and arranged in a second pattern, and third conductive contacts having a third pitch and arranged in a third pattern, wherein the second pitch is different than the first pitch, and wherein the third pitch is different than the first pitch and the second pitch;
a second die, between the first face of the RDL and the first face of the first die, having a first face and an opposing second face, wherein the second face of the second die includes second conductive contacts having the second pitch and arranged in the second pattern, and wherein respective ones of the second conductive contacts of the second die are electrically coupled to respective ones of the second conductive contacts of the first die; and
a third die, between the first face of the RDL and the first face of the first die, having a first face and an opposing second face, wherein the second face of the third die includes third conductive contacts having the third pitch and arranged in the third pattern, and wherein respective ones of the third conductive contacts of the third die are electrically coupled to respective ones of the third conductive contacts of the first die.

6. The microelectronic assembly of claim 5, wherein the first face of the first die further includes fourth conductive contacts having the second pitch and arranged in a fourth pattern, wherein the second face of the third die further includes fourth conductive contacts having the second pitch and arranged in the fourth pattern, and wherein respective ones of the fourth contacts of the third die are electrically coupled to respective ones of the fourth conductive contacts of the first die.

7. The microelectronic assembly of claim 5, wherein the first face of the first die further includes fourth conductive contacts having a fourth pitch and arranged in a fourth pattern, wherein the second face of the third die further includes fourth conductive contacts having the fourth pitch and arranged in the fourth pattern, and wherein respective ones of the fourth contacts of the third die are electrically coupled to respective ones of the fourth conductive contacts of the first die.

8. The microelectronic assembly of claim 5, wherein the first face of the first die further includes fourth conductive contacts having a fourth pitch and arranged in a fourth pattern, wherein the fourth pitch is different from the first, second, and third pitches, and the microelectronic assembly further comprises:
a fourth die, between the first face of the RDL and the first face of the first die, having a first face and an opposing second face, wherein the second face of the fourth die includes fourth conductive contacts having the fourth pitch and arranged in the fourth pattern, and wherein respective ones of the fourth conductive contacts of the fourth die are electrically coupled to respective ones of the fourth conductive contacts of the first die.

9. The microelectronic assembly of claim 5, wherein the RDL comprises one or more interconnect structures and the second die is between the first surface of the first die and at least a portion of the RDL.

10. The microelectronic assembly of claim 5, wherein the second die is an individual one of a plurality of second dies.

11. A method of manufacturing a microelectronic assembly, comprising:
interconnecting a second die to a first die, the first die including a first face and an opposing second face and the second die including a first face and an opposing second face, wherein the first face of the first die includes first conductive contacts having a first pitch and arranged in a first pattern, second conductive contacts having a second pitch and arranged in a second pattern, and third conductive contacts having a third pitch and arranged in a third pattern, wherein the second pitch is different than the first pitch and the third pitch is different than the first pitch and the second pitch, and wherein the second face of the second die includes second conductive contacts having the second pitch and arranged in the second pattern, and wherein respective ones of the second conductive contacts of the second die are electrically coupled to respective ones of the second conductive contacts of the first die; and
forming a redistribution layer, the redistribution layer comprising a plurality of conductive structures, wherein the second die is between at least a portion of the redistribution layer and the first die.

12. The method of manufacturing the microelectronic assembly of claim 11, wherein the second die is one of a plurality of second dies.

13. The method of manufacturing the microelectronic assembly of claim 12, further comprising:
forming a first layer extending from the first face of the first die, the first layer comprising an insulating material and a plurality of first interconnect structures in electrical contact with the second conductive contacts at the first face of the first die, wherein the plurality of second dies are interconnected to the first die by the first layer.

14. The method of manufacturing the microelectronic assembly of claim 13, wherein at least one second die has a first thickness and at least one other second die has a second thickness that is different than the first thickness of the at least one second die.

15. The method of manufacturing the microelectronic assembly of any of claim 13, further comprising:
forming a second layer extending from the first layer and from the second face of the plurality of second dies, the second layer comprising another insulating material and a plurality of other interconnect structures.

* * * * *